(12) United States Patent
Masuda

(10) Patent No.: US 9,095,018 B2
(45) Date of Patent: Jul. 28, 2015

(54) DISPLAY PANEL AND DISPLAY PANEL MANUFACTURING METHOD

(71) Applicant: JOLED INC., Tokyo (JP)

(72) Inventor: Hiroyuki Masuda, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/240,416

(22) PCT Filed: May 17, 2013

(86) PCT No.: PCT/JP2013/003156
§ 371 (c)(1),
(2) Date: Feb. 24, 2014

(87) PCT Pub. No.: WO2013/172040
PCT Pub. Date: Nov. 21, 2013

(65) Prior Publication Data
US 2014/0184059 A1    Jul. 3, 2014

(30) Foreign Application Priority Data

May 18, 2012   (JP) .................................. 2012-114850

(51) Int. Cl.
*H01L 51/52*   (2006.01)
*H01L 51/54*   (2006.01)
*H05B 33/04*   (2006.01)
*H05B 33/10*   (2006.01)

(52) U.S. Cl.
CPC ............ *H05B 33/04* (2013.01); *H01L 51/5246* (2013.01); *H05B 33/10* (2013.01)

(58) Field of Classification Search
CPC .... H05B 33/04; H05B 33/10; H01L 51/5246; H01L 51/50; G09F 9/30

USPC .................................................. 313/498–512
See application file for complete search history.

(56) References Cited

U.S. PATENT DOCUMENTS 5,985,069 A     11/1999  Kawabe et al.
6,791,660 B1 *   9/2004  Hayashi et al. ............... 349/190
(Continued)

FOREIGN PATENT DOCUMENTS

JP        10-116560        5/1998
JP        2003-228302      8/2003
(Continued)

OTHER PUBLICATIONS

International Search Report (ISR) in International Patent Application No. PCT/JP2013/003156, dated Aug. 27, 2013.

*Primary Examiner* — Anne Hines
*Assistant Examiner* — Jose M Diaz
(74) *Attorney, Agent, or Firm* — Greenblum & Bernstein, P.L.C.

(57) ABSTRACT

A display panel comprises a first substrate, a second substrate arranged opposite the first substrate, electroluminescence elements disposed between the first substrate and the second substrate, and a sealing member provided between the first substrate and the second substrate, sealing the electroluminescence elements. The sealing member includes a rectangular frame formed along a perimeter of the electroluminescence elements and a reinforced portion protruding outward from a corner portion of the rectangular frame, the reinforced portion includes a first side face cut so as to be flush with at least one corner side face of the first substrate, and a second side face cut so as to be flush with a corresponding corner side face of the second substrate.

15 Claims, 22 Drawing Sheets

(56) References Cited

U.S. PATENT DOCUMENTS

| | | |
|---|---|---|
| 7,151,585 B2 * | 12/2006 | Asakawa ............... 349/153 |
| 7,193,366 B2 | 3/2007 | Tomimatsu et al. |
| 2003/0178923 A1 * | 9/2003 | Omura et al. ............ 313/44 |
| 2004/0150319 A1 | 8/2004 | Tomimatsu et al. |
| 2004/0171184 A1 * | 9/2004 | Maruyama et al. ......... 438/33 |
| 2004/0239864 A1 * | 12/2004 | Asakawa ............... 349/153 |
| 2006/0109413 A1 | 5/2006 | Lee |
| 2006/0197446 A1 | 9/2006 | Tomimatsu et al. |
| 2011/0237150 A1 * | 9/2011 | Ito et al. ............... 445/44 |
| 2011/0249376 A1 * | 10/2011 | Wu .................. 361/679.01 |
| 2012/0099061 A1 * | 4/2012 | Lee ................... 349/110 |
| 2012/0146487 A1 * | 6/2012 | Kim ................... 313/504 |
| 2012/0320329 A1 * | 12/2012 | Lee et al. .............. 349/158 |
| 2013/0306235 A1 | 11/2013 | Masuda |
| 2014/0036205 A1 | 2/2014 | Sugiura |
| 2014/0209172 A1 * | 7/2014 | Tani et al. ............. 136/263 |

FOREIGN PATENT DOCUMENTS

| | | |
|---|---|---|
| JP | 2004-288554 | 10/2004 |
| JP | 2005-084323 | 3/2005 |
| JP | 2006-146221 | 6/2006 |
| JP | 2007-250507 | 9/2007 |
| JP | 2009-016185 | 1/2009 |
| JP | 2011-123150 | 6/2011 |

* cited by examiner

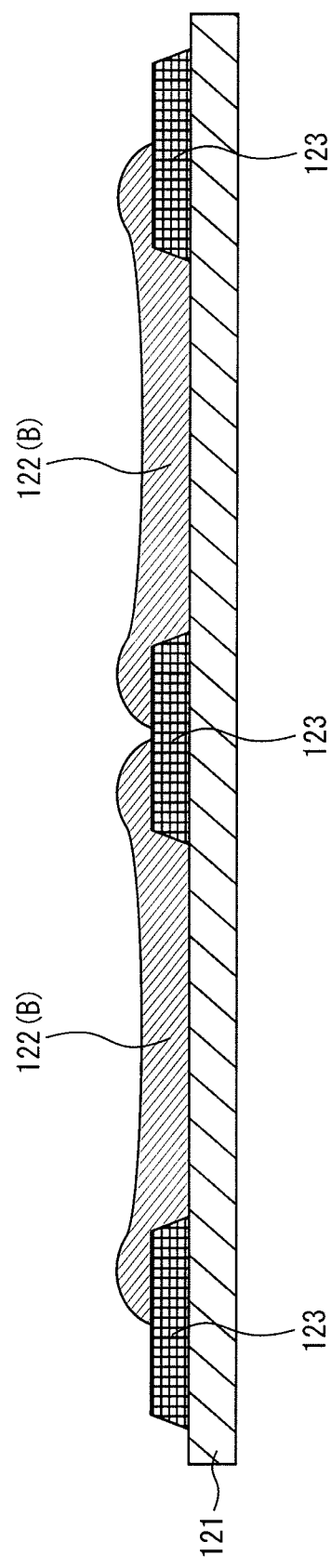

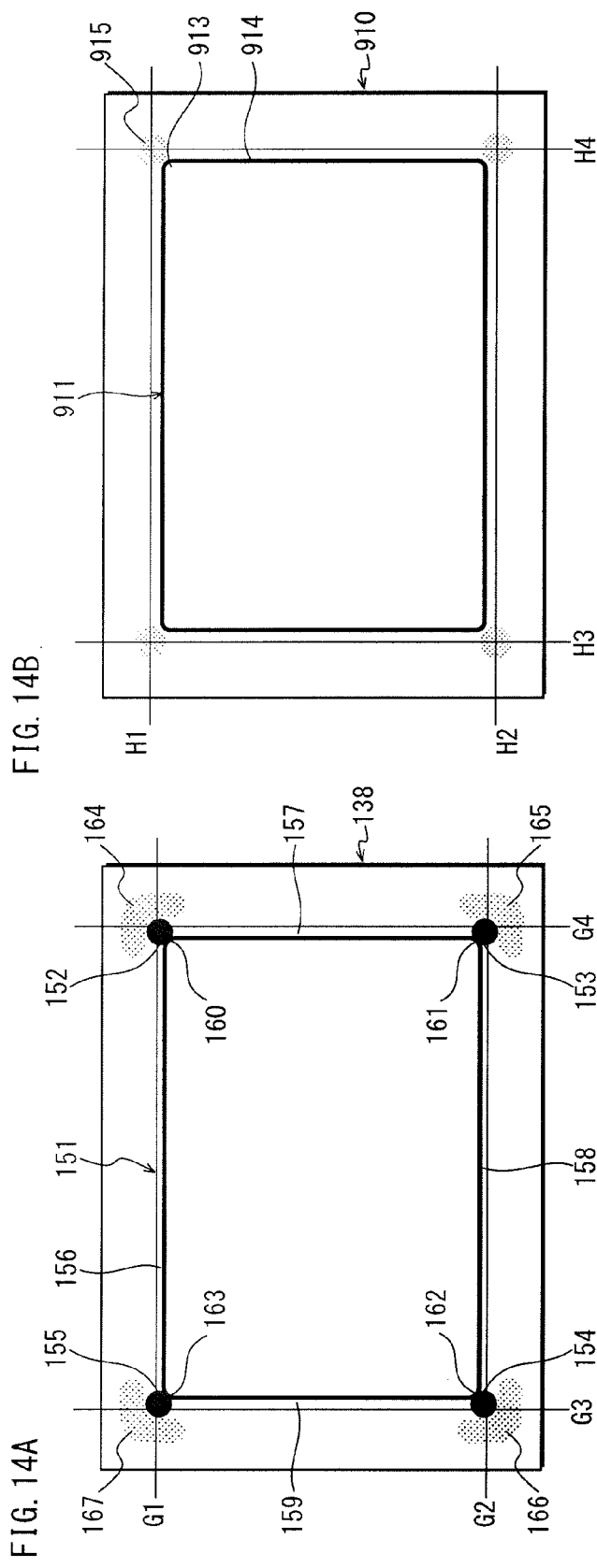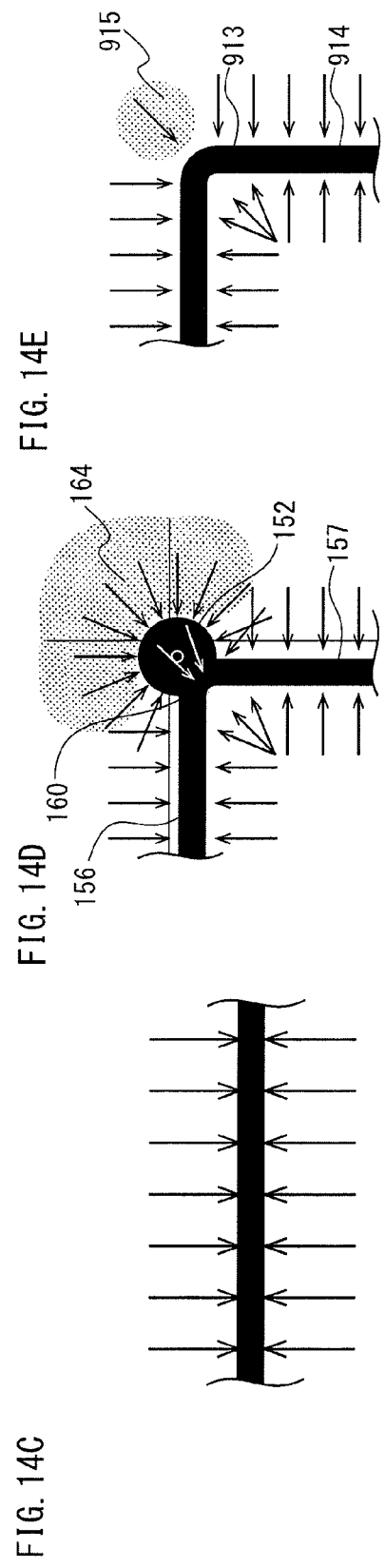

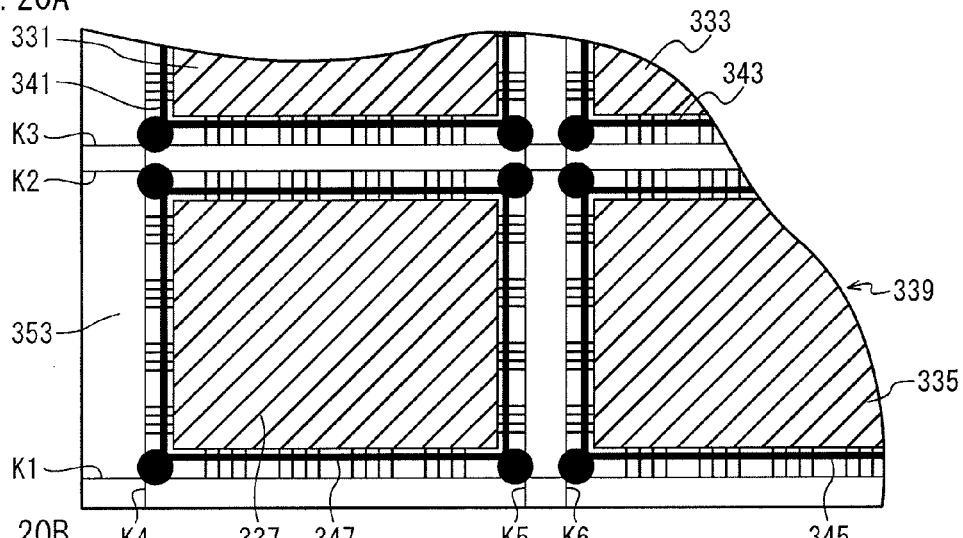
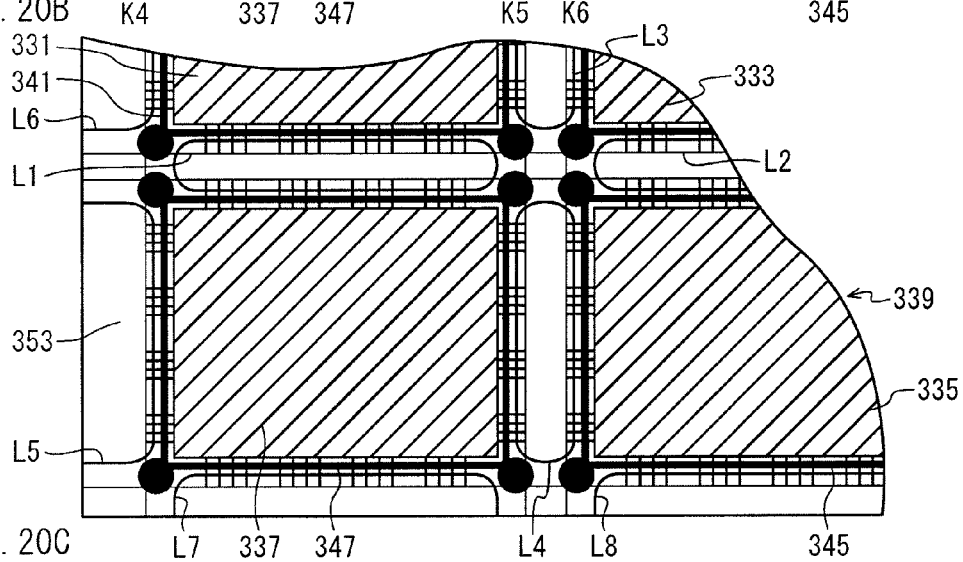
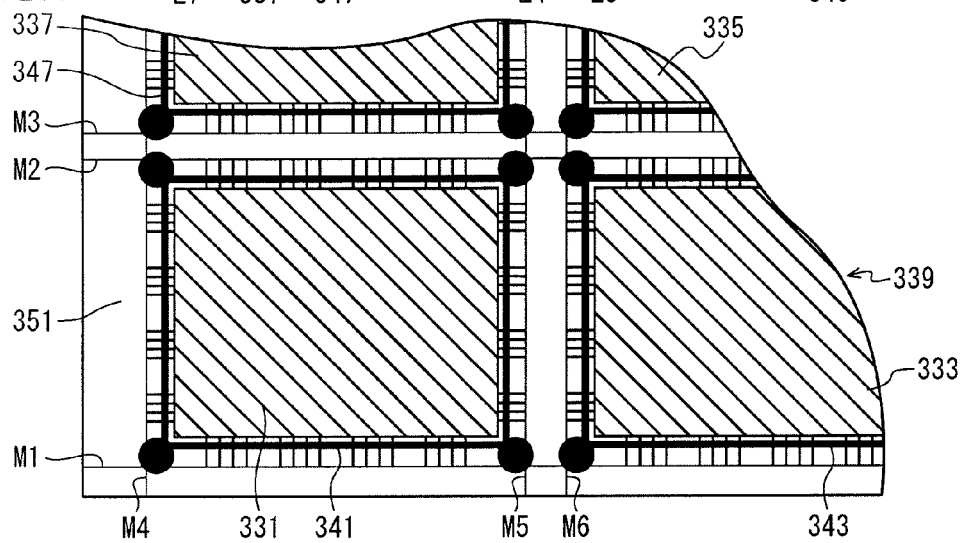

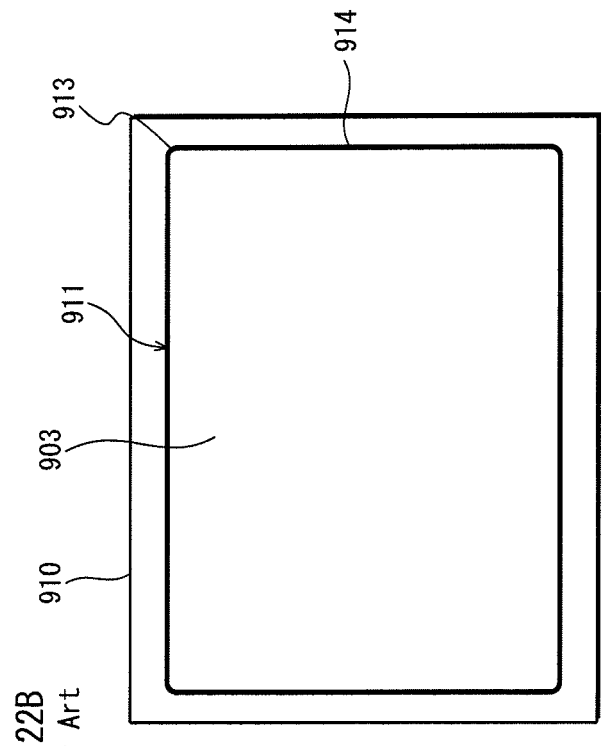
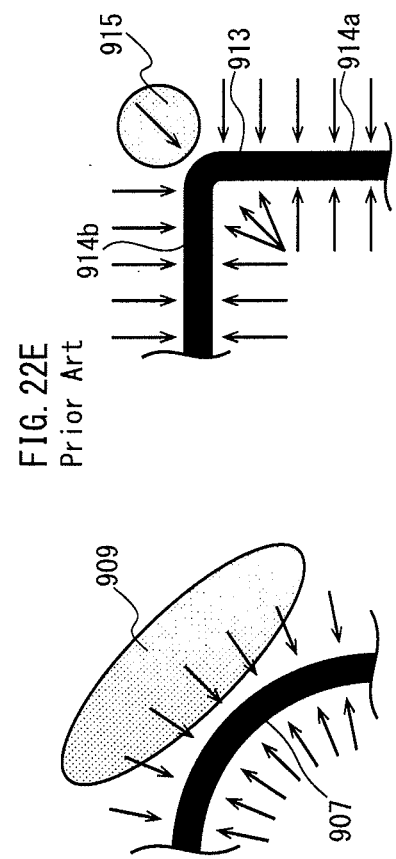
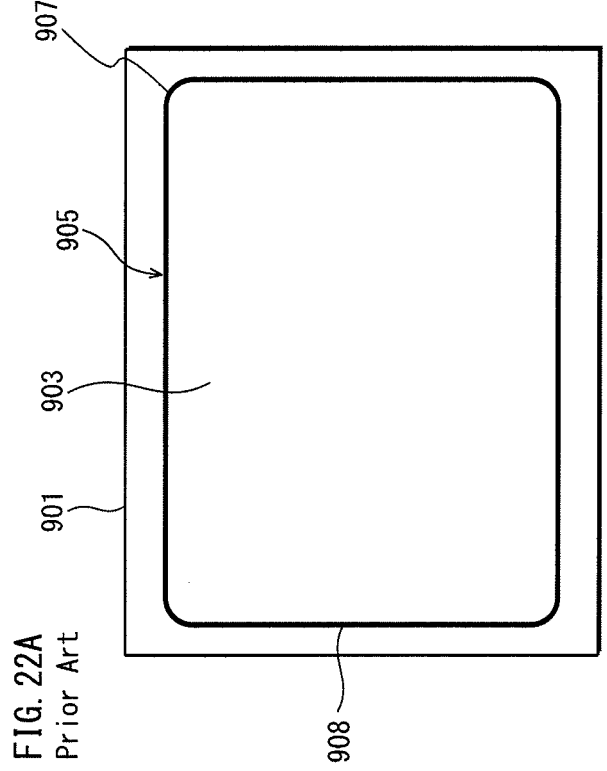
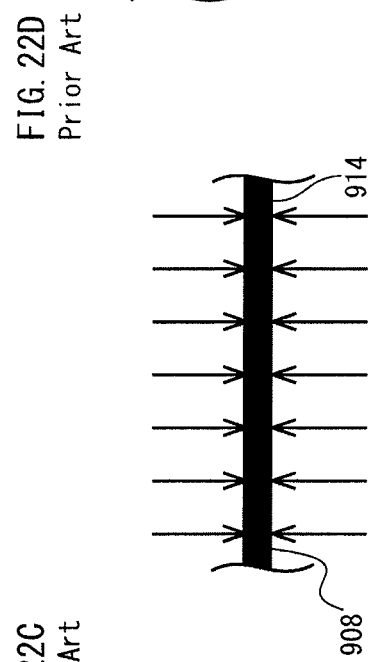
FIG. 22A Prior Art
FIG. 22B Prior Art
FIG. 22C Prior Art
FIG. 22D Prior Art
FIG. 22E Prior Art

DISPLAY PANEL AND DISPLAY PANEL MANUFACTURING METHOD

TECHNICAL FIELD

The present disclosure pertains to a display panel and a manufacturing method therefor, where a display region provided between two opposing substrates is sealed by a sealing member that surrounds the display region while also being provided between the substrates.

BACKGROUND ART

An organic electroluminescence (hereinafter, EL) element is a type of self-illuminating element and, as such, requires no backlight while providing a wide viewing angle, is easily applicable to thinning and power consumption reduction, and has a high response speed, among other merits. An organic electroluminescence panel (hereinafter, EL panel) in which such EL elements are arranged has come to attention as a next-generation display panel serving as a replacement for liquid crystal devices.

Typically, an organic EL element has an organic EL laminate structure in which a an organic material layer that includes a lower electrode and a light-emitting layer is sequentially layered on a substrate with an upper electrode.

The material used for the organic EL laminate structure is typically unstable and highly active, prone to reacting with water and oxygen in the atmosphere. These reactions with atmospheric water and oxygen are a cause of deterioration in the properties of the organic EL element. As such, sealing the organic EL element of the organic EL display panel from the atmosphere is indispensible.

A sealing member is provided in order to prevent deterioration due to the infiltration of water and oxygen from the outside atmosphere into the light-emitting element of the organic El element within a display region.

The display region is sealed by applying a paste (e.g., a glass paste) that includes a sealing material (e.g., frit glass) so as to surround the display region (i.e., a planned formation region for the element) on one of two substrates, drying and joining to the other substrate, and then fusing (i.e., baking) the sealing material. Upon baking, the sealing material is termed a sealing member.

The display panel is obtained by cutting away peripheral areas of an intermediate panel produced by joining the two substrates (i.e., sealing with the sealing member).

CITATION LIST

Patent Literature

Patent Literature 1

Japanese Patent Application Publication No. H10-116560

SUMMARY OF INVENTION

Technical Problem

In recent years, demand has intensified for distance between the display region and the display panel periphery to be reduced, that is, for reduction in the width of the frame. Reducing the occurrence of breakage and so on in the sealing member and constraining decreases in manufacturing efficiency are also beneficial.

In consideration of the above-described problem, the present invention aims to provide a display panel and a manufacturing method therefor, enabling a reduction in the width of the frame while also maintaining manufacturing efficiency.

Solution to Problem

In order to address this problem, a display panel pertaining to an aspect of the present disclosure comprises: a first substrate; a second substrate arranged opposite the first substrate; a plurality of electroluminescence elements disposed between the first substrate and the second substrate; and a sealing member provided between the first substrate and the second substrate, sealing the electroluminescence elements, wherein the sealing member includes a rectangular frame formed along a perimeter of the electroluminescence elements, and a reinforced portion protruding outward from a corner portion of the rectangular frame, the reinforced portion includes a first side face cut so as to be flush with at least one corner side face of the first substrate, and a second side face cut so as to be flush with a corresponding corner side face of the second substrate, and the first side face and the second side face are coplanar.

Also, a manufacturing method for a display panel pertaining to another aspect of the disclosure comprises: forming a plurality of electroluminescence elements within a central region of a first substrate; using a sealing material to provide, on one of the first substrate and a second substrate, a rectangular frame surrounding a region corresponding to the central region and a reinforced portion protruding outward from a corner portion of the rectangular frame; sealing the electroluminescence elements by joining the first substrate and the second substrate with the sealing material interposed therebetween; and cutting the first substrate and the second substrate, wherein cutting the first substrate and the second substrate involves cutting the reinforced portion while overlapping with respective corner portions of the first substrate and the second substrate, as viewed from a joining direction.

Advantageous Effects of Invention

The display panel pertaining to one aspect of the present disclosure has a reinforced portion protruding outward from a corner portion of a rectangular frame, such that residual strain, produced during heating in the manufacturing process of the display panel, mainly occurs in regions outside the reinforced portion. The reinforced portion also includes a side face cut so as to be aligned with a side face of a corner portion of at least one of a first substrate and a second substrate. Thus, cutting is performed closer to the center of the display panel than a region where the residual strain occurs. In comparison to cutting inside the region where the residual strain occurs, this approach better prevents fracturing of the first and second substrates during the cutting process, thereby improving manufacturing efficiency (i.e., yield optimisation).

Accordingly, the reinforced portions protrude outward from the corner portions of the rectangular frame. However, given that the reinforced portions include a side face cut so as to be aligned with at least one side face of a corner portion of a first substrate and a corner portion of a second substrate, cutting is performed across the reinforced portions. As a result, the amount of protrusion from the corner portions of the rectangular frame is reduced, thereby satisfying the demand for reduction in the width of the frame.

As described above, the presence of the reinforced portions protruding outward from the corner portions of the rectangular frame enables fractures of the first and second substrates due to residual strain to be prevented at cutting time, and enables the radius of the corner portions to be reduced (i.e., provides corners closer to right angles) so as to respond to demand for reduction in the width of the frame.

BRIEF DESCRIPTION OF DRAWINGS

FIG. 7 is a cross-section of FIG. 5 taken along line D1-D2.

FIG. 8A represents a glass substrate prior to frit paste application, FIG. 8B represents the glass substrate after frit paste application, FIG. 8C represents frit paste baking, and FIG. 8D represents a baked glass substrate.

FIG. 9A illustrates the colour filter substrate and the EL substrate prior to joining, FIG. 9B illustrates the joined colour filter and EL substrates, FIG. 9C illustrates a resin curing process, and FIG. 9D illustrates the EL unification process.

FIG. 10A is a schematic illustration, FIG. 10B is a perspective view of the frit paste after application when the dispenser device has advanced linearly, and FIG. 10C is a perspective view of the frit paste after application when the dispenser device has advanced rotationally.

FIG. 11A is a perspective view and FIG. 11B is a magnified view of a reinforced portion.

FIG. 12A illustrates the beginning of application, FIG. 12B illustrates a stage where one reinforced portion has been formed, and FIG. 12C illustrates the completed frit paste application.

FIGS. 14A-14E illustrate the relationship between strain positions and scribed lines, where FIG. 14A illustrates an intermediate panel pertaining to an Embodiment, FIG. 14B illustrates a conventional intermediate panel, FIG. 14C is a magnified view of portions common to FIGS. 14A and 14B, FIG. 14D is a magnified view of a corner portion in FIG. 14A, and FIG. 14E is a magnified view is a magnified view of a corner portion in FIG. 14B.

FIG. 17A illustrates a case where the display panel pertaining to Embodiment 2 is used, FIG. 17B is an expanded view of a cross-section of FIG. 17A taken along line X1-X2, FIG. 17C illustrates a case where a conventional display panel is used, and FIG. 17D is an expanded view of a cross-section of FIG. 17C taken along line X3-X4.

FIGS. 20A-20C illustrate the cutting of the display panels from the large intermediate panel, where FIGS. 20A and 20B show the large intermediate panel as seen from the colour filter substrate, and FIG. 20C shows the large intermediate panel as seen from the EL substrate.

FIGS. 22A-22E illustrate the intermediate panel prior to cutting according to conventional technology, where FIG. 22A illustrates a case where the radius of the corner portions of the rectangular sealing member has been increased, FIG. 22B illustrates a case where the radius of the corner portions of the rectangular sealing member has been decreased, FIG. 22C is a magnified view of the common edge portions from FIGS. 22A and 22B, FIG. 22D is a magnified view of a corner portion from FIG. 22A, and FIG. 22E is a magnified view of a corner portion from FIG. 22B.

DESCRIPTION OF EMBODIMENTS

Overview of Embodiments

Figure 1:
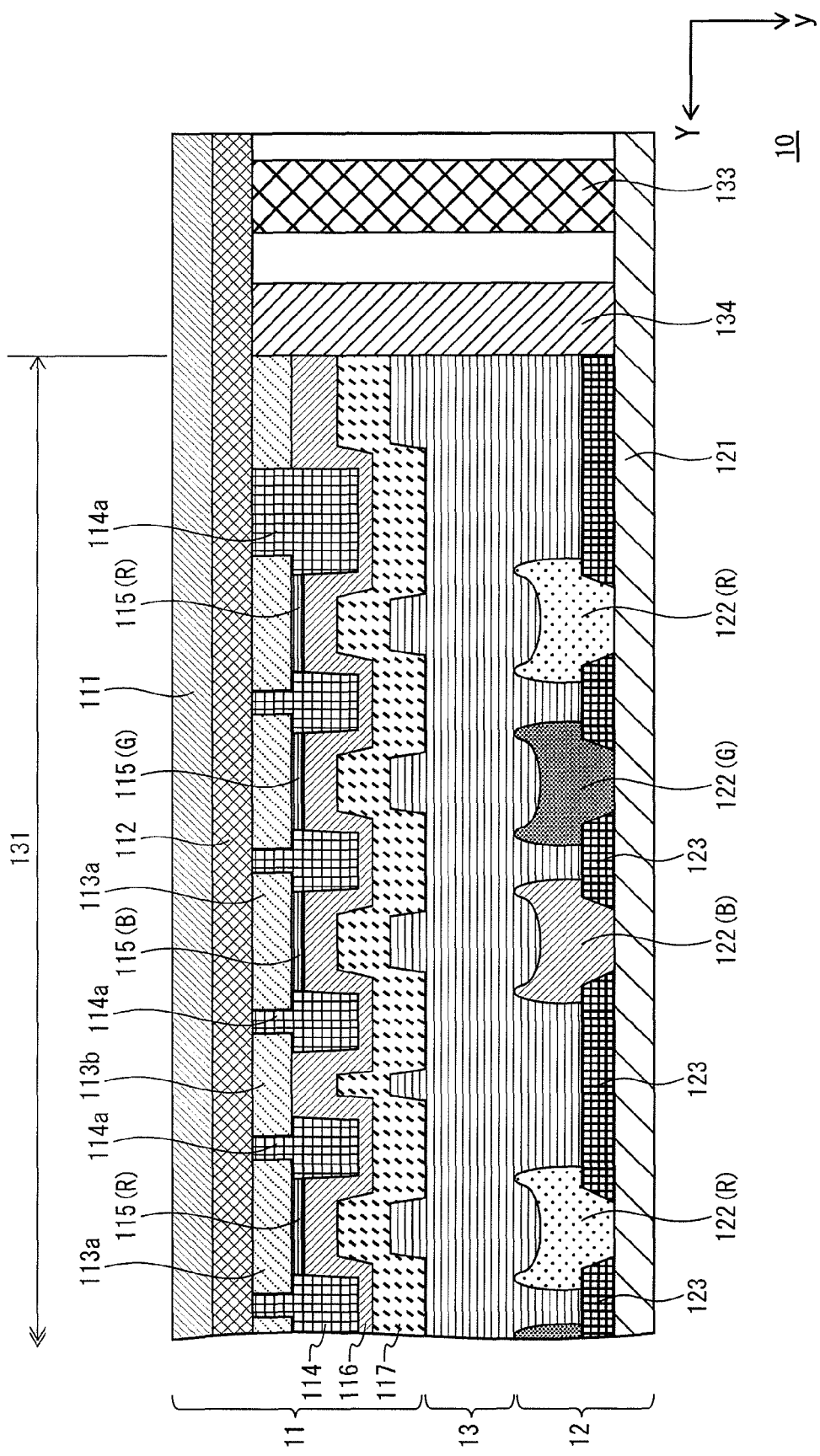
FIG. 1 is a partial cross-sectional diagram schematically illustrating key portions of a display panel pertaining to Embodiment 1.

In one aspect, a display panel comprises: a first substrate; a second substrate arranged opposite the first substrate; a plurality of electroluminescence elements disposed between the first substrate and the second substrate; and a sealing member provided between the first substrate and the second substrate, sealing the electroluminescence elements, wherein the sealing member includes a rectangular frame formed along a perimeter of the electroluminescence elements, and a reinforced portion protruding outward from a corner portion of the rectangular frame, the reinforced portion includes a first side face cut so as to be flush with at least one corner side face of the first substrate, and a second side face cut so as to be flush with a corresponding corner side face of the second substrate, and the first side face and the second side face are coplanar.

Also, the first substrate and the second substrate have corresponding side faces. Accordingly, the reinforced portions, the first substrate, and the second substrate can be cut simultaneously, thereby improving manufacturing efficiency.

In another aspect, the electroluminescence elements are mounted on the first substrate, and a side face of the second substrate is indented toward a second substrate center with respect to a line extending from the corner side face of the second substrate. Accordingly, the reinforced portions of the sealing member remain between the first and second substrates, thereby enabling the display panel strength to be preserved.

In a further aspect, an indented portion of the side face of the second substrate is closer to the second substrate center than a side face of the first substrate is to the second substrate center. Accordingly, an auxiliary electrode or similar may be arranged in a region of the first substrate that does not face the second substrate.

In an additional aspect, the sealing member is frit glass. Accordingly, when frit glass is used as the sealing member material, for instance, the material greatly differs in elasticity from the substrate, and more stress is applied between the substrate and the frit glass when the frit glass hardens and contracts than when resin material is used for the sealing member. In contrast, the above-described configuration enables the frit glass to be used as the sealing member.

In an alternate aspect, the sealing member further includes a reinforced middle portion protruding outward from an inter-corner portion of the rectangular frame. Accordingly, when, for example, the peripheral portions of the first and second substrates are fixed by the fixing material, deformation of the substrates is reduced between the corner portions thereof.

Also, in one aspect, a manufacturing method for a display panel comprises: forming a plurality of electroluminescence elements within a central region of a first substrate; using a sealing material to provide, on one of the first substrate and a second substrate, a rectangular frame surrounding a region corresponding to the central region and a reinforced portion protruding outward from a corner portion of the rectangular frame; sealing the electroluminescence elements by joining the first substrate and the second substrate with the sealing material interposed therebetween; and cutting the first substrate and the second substrate, wherein cutting the first substrate and the second substrate involves cutting the reinforced portion while overlapping with respective corner portions of the first substrate and the second substrate, as viewed from a joining direction. Accordingly, the display panel is able to satisfy the aims of manufacturing efficiency as well as reduction in the width of the frame.

In another aspect, the reinforced portion is cut while simultaneously overlapping with both of the respective corner portions of the first substrate and the second substrate, as viewed from the joining direction, such that overlapping portions are flush. Accordingly, the display panel is manufactured efficiently.

In yet another aspect, the second substrate is cut such that a side face thereof is indented toward a second substrate center with respect to a line extending from the corner portion. Accordingly, the reinforced portions of the sealing member remain between the first and second substrates, thereby enabling the display panel strength to be preserved.

EMBODIMENTS

The following describes a display panel pertaining to Embodiments of the disclosure as well as a manufacturing method therefor, with reference to the accompanying drawings. In the Embodiments, the materials and dimensions listed as being used are given as beneficial examples. No limitation is intended thereto. Also, appropriate variations may be made, provided that no deviation from the technical intent of the disclosure arises. Further, the Embodiments may be freely combined provided that no contradiction results.

Embodiment 1

1. Configuration
(1) Overall Configuration

FIG. 1 is a partial cross-sectional diagram schematically illustrating key portions of a display panel 10 pertaining to Embodiment 1.

As shown, the display panel 10 includes an EL substrate 11 and a colour filter (hereinafter also CF) substrate 12, as well as a sealing resin layer 13 interposed between the EL substrate 11 and the CF substrate 12.

The sealing resin layer 13 is provided and applied in liquid form and then cured, with the aims of conjoining the EL substrate 11 and the CF substrate 12 and of protecting the EL substrate 11 from infiltration by water and gas from outside the display panel 10. However, the sealing resin layer 13 is not strictly necessary and may be omitted from the configuration.

Light exits the display panel 10 from the top or front. However, with respect to FIG. 1, light exits from the bottom as drawn.

(2) EL Substrate

The EL substrate 11 is made up of a substrate, an inter-layer insulation film, an anode, a bank, a light-emitting layer, and so on.

Figure 2:
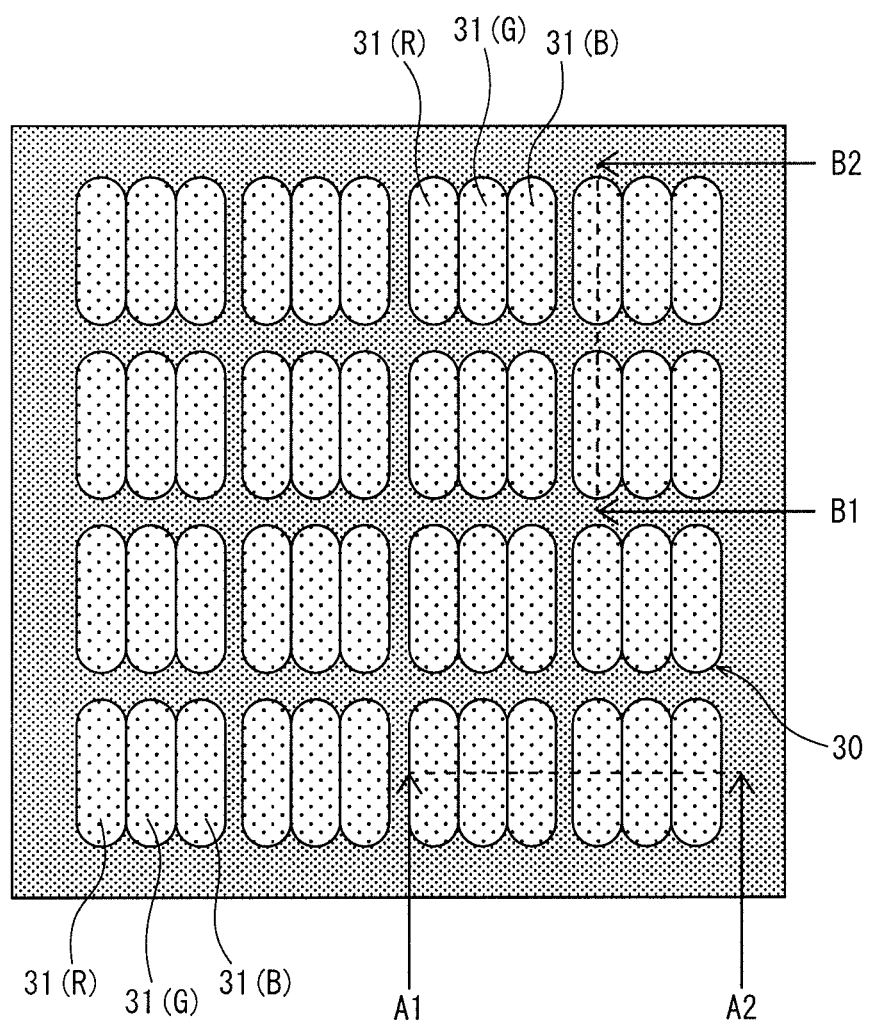
FIG. 2 is a plan view of an EL substrate.
Figure 3:
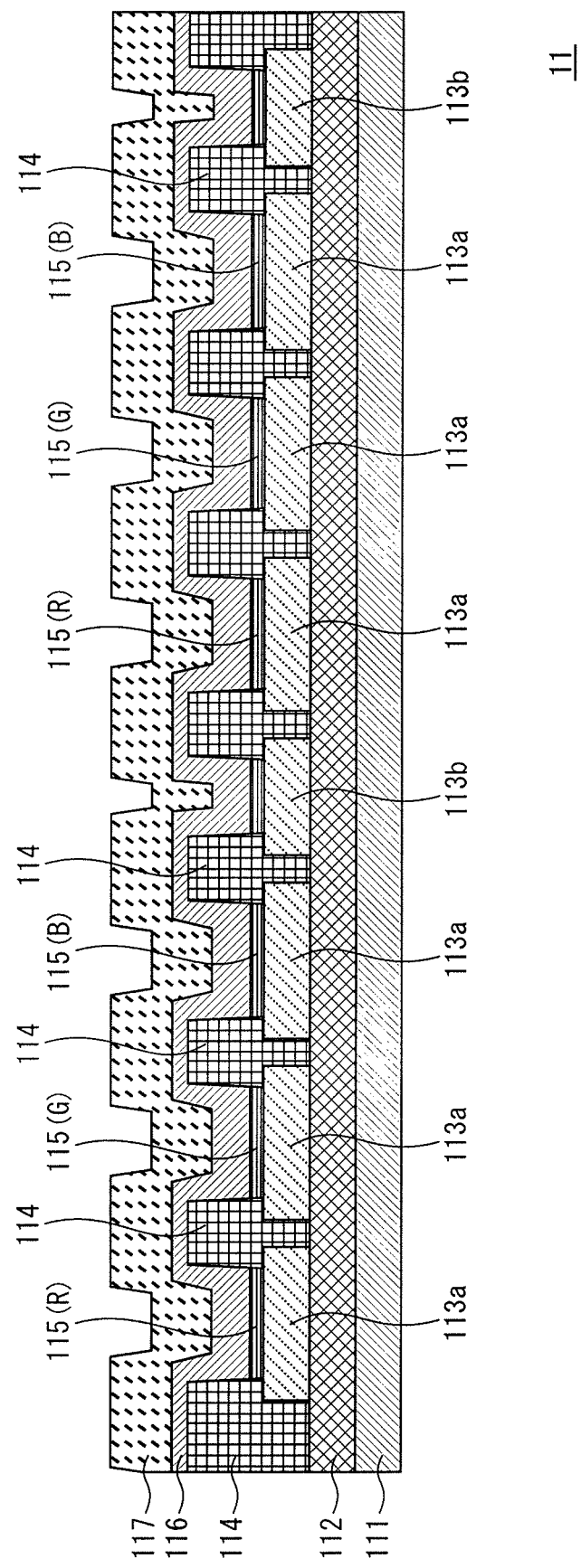
FIG. 3 is a cross-section of FIG. 2 taken along line A1-A2.
Figure 4:
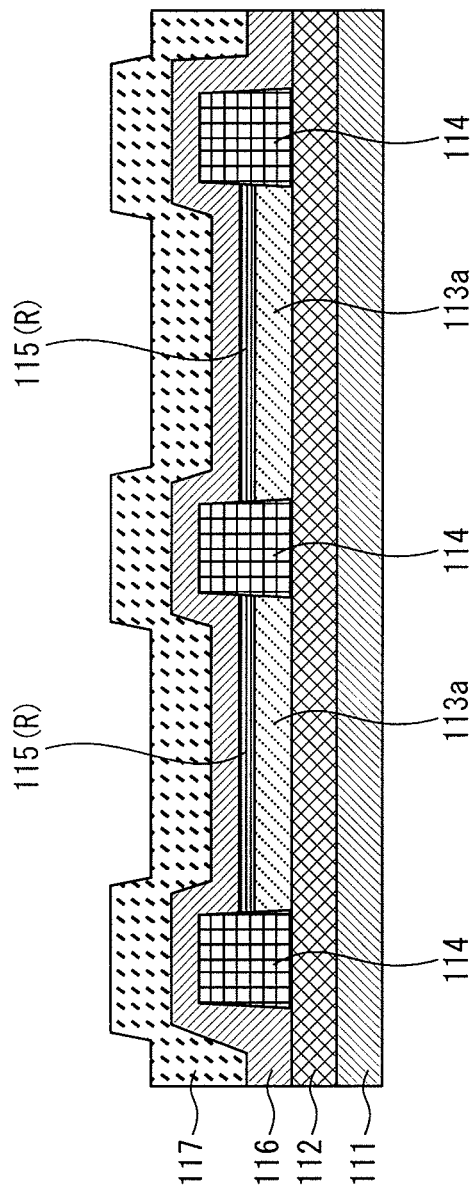
FIG. 4 is a cross-section of FIG. 2 taken along line B1-B2.

FIG. 2 is a plan view of the EL substrate. FIG. 3 is a cross-section of FIG. 2 taken along line A1-A2. FIG. 4 is another cross-section of FIG. 2, taken along line B1-B2.

Here, the side of the EL substrate 11 that is joined to the CF substrate 12 is the top face or front (the lower side as illustrated in FIG. 1).

The EL substrate 11 includes a substrate (111) having a plurality of pixels 30 disposed thereon in rows and columns. Here, each of the pixels 30 is made up of three light-emitting elements 31(R), 31(G), and 31(B) (in three colours R, G, and B). The light-emitting elements are referred to in generality, irrespective of colour, with the reference sign 31. The pixels 30 are arranged as a matrix disposed in a display region 131.

Here, the substrate (111) corresponds to the first substrate of the disclosure, and the light-emitting elements 31 correspond to the electroluminescence elements of the disclosure.

The display region 131 represents a region in which the EL substrate 11 and the CF substrate 12 are joined, formed by the pixels 30 and colour filters 122 and displaying an image, and includes a planned formation region for the pixels 30 on the EL substrate (i.e., a TFT substrate) and a planned formation region for the colour filters 122 on the CF substrate (i.e., a glass substrate).

Here, each of the light-emitting elements 31 is formed longitudinally, and the three light-emitting elements 31(R), 31(G), and 31(B) neighbour each other with respect to the shorter dimension. As such, each of the pixels 30 is formed so as to be substantially square as seen in the plan view (see FIG. 2). The plurality of pixels 30 form an EL element 30a.

The following description is made with primary reference to FIGS. 2-4.

The substrate is a TFT substrate 111. An inter-layer insulation film 112 is formed over the top face of the TFT substrate 111.

Anodes 113a are disposed in correspondence with light-emitting element 31 units on the top face of the inter-layer insulation film 112. The anodes 113a are formed longitudinally, similar to the light-emitting element 31 as seen in the plan view. As shown in FIGS. 3 and 4, in addition to the anodes 113a, auxiliary electrodes 113b are also formed on the top face of the inter-layer insulation film 112, between the pixels 30.

A bank 114 is formed between the anodes 113a, as well as between the anodes 113a and the auxiliary electrodes 113b. The bank 114 is formed so as to extend from an area on the inter-layer insulation film 112 where the anodes 113a and the auxiliary electrodes 113b are not formed, and between the anodes 113a and the auxiliary electrodes 113b, so as to protrude upward.

A light-emitting layer 115 (here, an organic light-emitting layer) of a predetermined colour is layered over the top face of the anodes 113a in each region defined by (i.e., surrounded by) the bank 114.

Here, the predetermined colour is one of blue, green, and red, though other colours such as yellow may also be included. In the drawings, the blue light-emitting layer is denoted 115 (B), the green light-emitting layer is denoted 115 (G), and the red light-emitting layer is denoted 115 (R). The reference sign 115 is also used to refer to the light-emitting layers in generality, irrespective of colour.

A cathode 116 and a sealing layer 117 are respectively formed over the surfaces of each organic light-emitting layer 115 so as to extend beyond the region defined by the bank 114 into neighbouring organic light-emitting layers 115, and over the top faces of the auxiliary electrodes 113b. The sealing layer 117 serves to prevent the organic light-emitting layers 115 from being exposed to water or to air.

(3) CF Substrate

Figure 5:
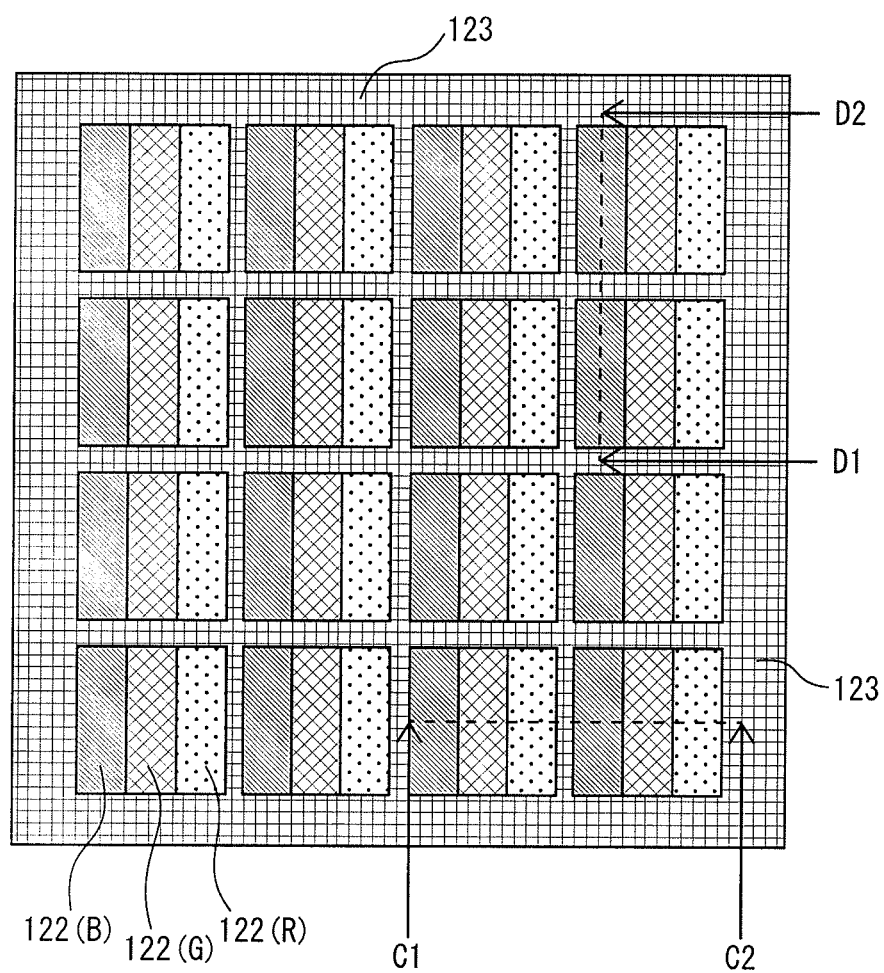
FIG. 5 is a plan view of a colour filter substrate.
Figure 6:
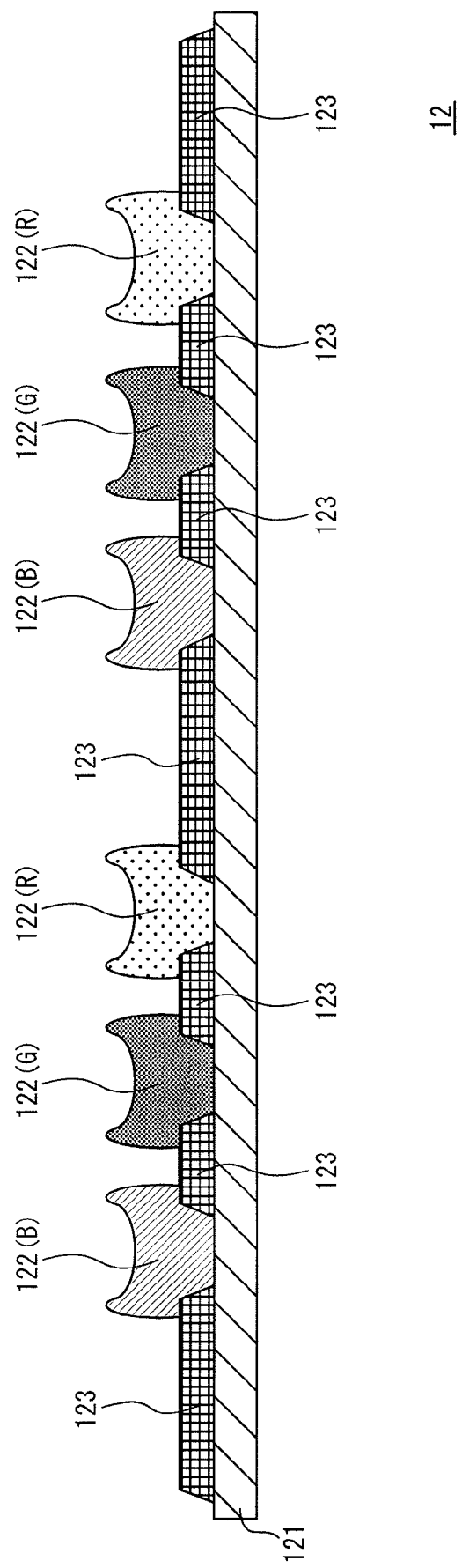
FIG. 6 is a cross-section of FIG. 5 taken along line C1-C2.

FIG. 5 is a plan view of the CF substrate. FIG. 6 is a cross-section of FIG. 5 taken along line C1-C2. FIG. 7 is another cross-section of FIG. 5, taken along line D1-D2.

Here, the side of the CF substrate 12 that is joined to the EL substrate 11 is the top face or surface (the upper side as illustrated in FIG. 1).

The CF substrate 12 includes a substrate 121, colour filters 122, and so on. The substrate 121 corresponds to the second substrate of the disclosure.

As shown in FIG. 5, the colour filters 122 are formed longitudinally, similar to the light-emitting elements 31 shown in the plan view of FIG. 2.

The following description is made with primary reference to FIGS. 6 and 7.

The substrate 121 is a front-face substrate of the display panel 10 and is made from an optically transmissive material. Colour filters 122 (B), 122(G), and 122(R) are formed on the top face of the substrate 121 in correspondence with the organic light-emitting layers 115 (B), 115 (G), and 115 (R) of the EL substrate 11. Reference sign 122 is also used to refer to the colour filters in generality, irrespective of colour.

A black matrix 123 (hereinafter, BM) is formed between the colour filters 122 on the top face of the substrate 121. As shown in FIGS. 6 and 7, each of the colour filters 122 is formed so as to extend partially into a peripheral region of the neighbouring BM 123 on each side.

The BM 123 is a black layer that prevents the incidence of light from the outside and of light reflected back from the display surface of the display panel 10, and is intended to improve the display contrast. As shown in FIG. 1, the BM 123 is formed in correspondence with (i.e., opposite) the bank 114 on the EL substrate 11.

The display region having the colour filters 122 and the BM 123 formed therein is a colour filter 122a.

(4) Periphery

The display panel 10 is provided with sealant 134 and a sealing member 133 at the periphery thereof. Specifically, the sealant 134 and the sealing member 133 are provided so as to surround the periphery of the display region 131, the sealing member 133 being disposed outside the sealant 134. The sealant 134 seals the interior between the joined EL substrate 11 and CF substrate 12.

In the present description, the sealing member refers to a sealing material that is fused and unified with the EL substrate 11 and with the CF substrate 12 so as to seal the display region 131, and also uses reference sign 133.

2. Manufacturing Method

The following example of a manufacturing method of the display panel 10 includes an EL preparation process (1) of preparing the EL substrate 11a, a colour filter preparation process (2) of preparing the CF substrate 12a to which the sealing material is applied, a conjoining process (3) of conjoining the prepared EL substrate 11a and the prepared CF substrate 12a, and a cutting process (4) of cutting the perimeter of an intermediate panel 138. Here, a paste that includes the sealing material is used. Specifically, the sealing material is a glass frit, and the paste is a frit paste.

(1) EL Preparation Process

The EL preparation process serves to prepare the EL substrate 11a. Specifically, the light-emitting elements 31 (i.e., EL element 30a) are formed on the substrate. Given that this process involves forming light-emitting elements using well-known conventional technology, the explanation thereof is abridged. The EL substrate 11 of the display panel 10 has had peripheral portions (i.e., unneeded portions) of the EL substrate 11a cut away.

(2) Colour Filter Process

The colour filter preparation process includes an application process of applying the frit paste to the substrate, a unification process of unifying the applied frit paste (more accurately, the frit glass in the frit paste) with the substrate, and a colour filter formation process of forming the colour filters 122a on the substrate. Here, the substrate having the colour filters 122a formed thereon is the CF substrate 12a. The CF substrate 12 of the display panel 10 has had peripheral portions (i.e., unneeded portions) of CF substrate 12a cut away.

The following describes the process in detail, with reference to the drawings. This process includes processes of unifying the frit glass with the EL substrate and with the CF substrate. As such, the processes are illustrated on separate drawings, one indicating a CF unification process for the CF substrate and one indicating an EL unification process for the EL substrate.

Figure 8A:
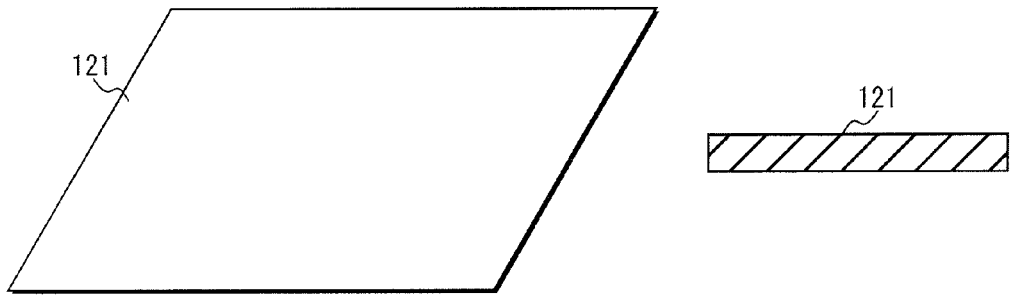
FIGS. 8A-8D illustrate a colour filter process, where
Figure 8B:
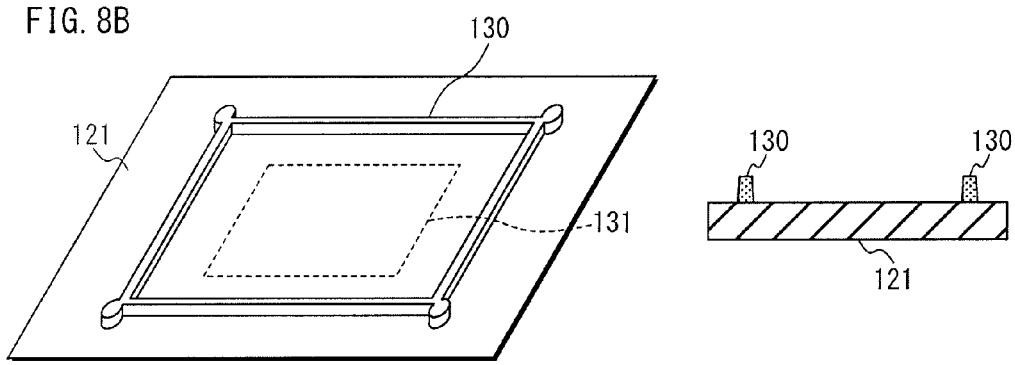
Figure 8C:
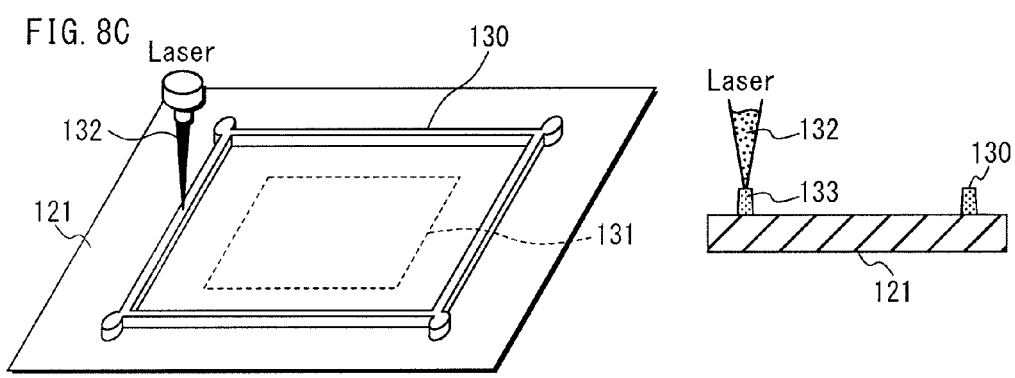
Figure 8D:
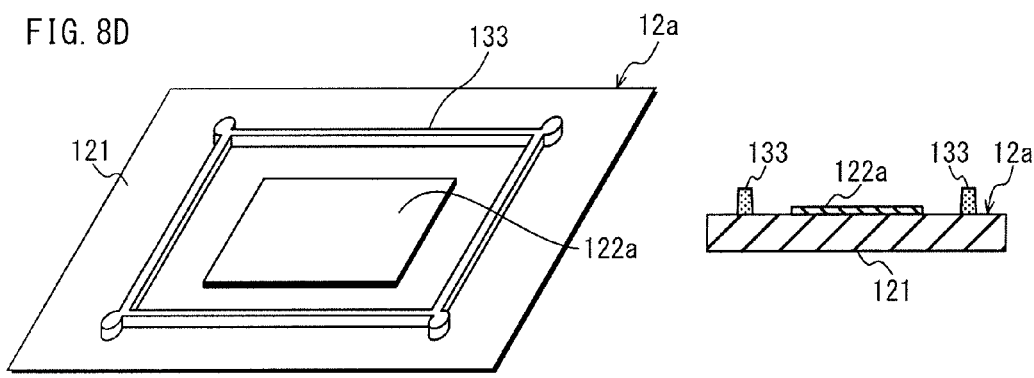

FIGS. 8A-8D illustrate the colour filter process. FIG. 8A represents the glass substrate prior to frit paste application. FIG. 8B represents the glass substrate after frit paste application. FIG. 8C represents the frit paste baking. FIG. 8D represents the baked glass substrate.

Each of FIGS. 8A-8D includes two drawings on the left-hand and right-hand sides, showing the same part of the process. The left-hand side is a perspective view diagram and the right-hand side is a cross-sectional diagram.

(a) Application Process

The glass substrate 121 is prepared as shown in FIG. 8A, then the frit paste 130 is applied to the top face of the glass substrate 121 as shown in FIG. 8B.

The frit paste 130 is applied using a dispenser method so as to surround the perimeter of the display region 131 (i.e., the planned formation region for the colour filter 122a).

(b) CF Unification Process

The CF unification process includes a dry process of removing the solvent from the frit paste 145 and a baking process of removing the binder and so on from the frit paste 145.

As shown in FIG. 8C, the baking process is performed using a laser 132. The binder and so on are removed and the frit glass (i.e., glass powder) in the frit paste 145 is fused. Thus, the glass substrate 121 is unified with the frit glass as shown in FIG. 8D. The sealing material 133 is produced once the frit glass is baked and unified with the glass substrate 121.

(c) Colour Filter Formation Process

The colour filter formation process involves forming the colour filter 122a on the display region 131 of the glass substrate 121 having the sealing material 133 formed thereon. Given that this process involves using well-known conventional technology, the explanation thereof is abridged. This completes the CF substrate 12a.

(3) Conjoining Process

The conjoining process includes a sealant application process of applying the sealant to the CF substrate 12a, a resin material application process of applying a resin material for sealing to the colour filter 122a on the CF substrate 12a, a joining process of joining the EL substrate 11a to the CF substrate 12a having the sealant and the resin material applied thereto, a decompression process of having the joined EL substrate 11a and CF substrate 12a enter a decompressed state, a resin curing process of curing the resin material, and an EL unification process of unifying the EL substrate 11a with the sealing material 133.

The following describes the process in detail, with reference to the drawings.

Figure 9A:
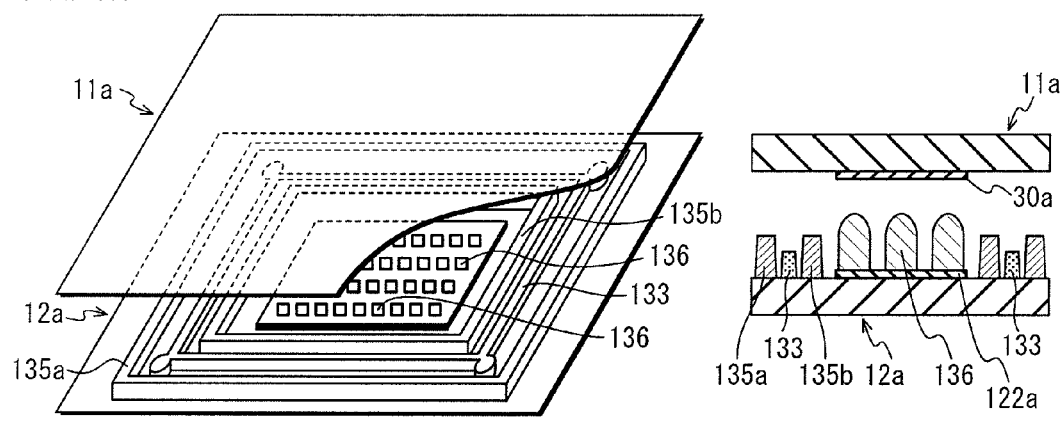
FIGS. 9A-9D illustrate a conjoining process, where
Figure 9B:
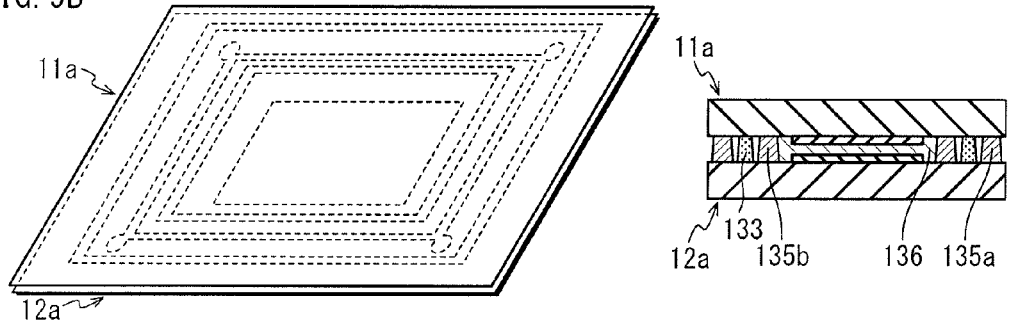
Figure 9C:
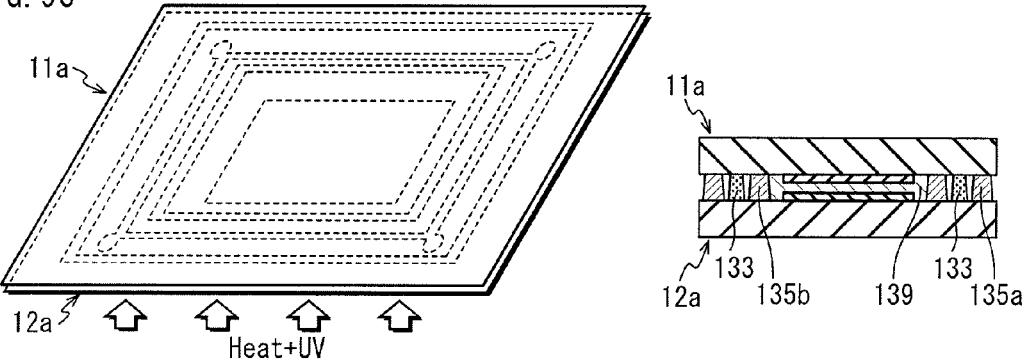
Figure 9D:
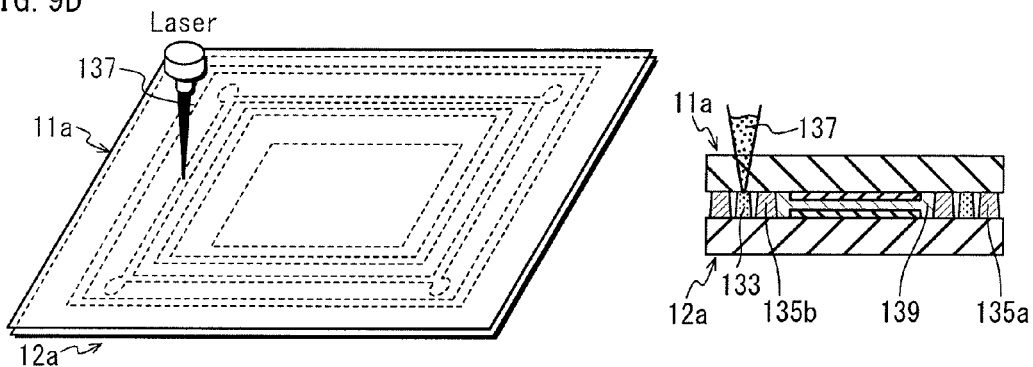

FIGS. 9A-9D illustrate the conjoining process. FIG. 9A illustrates the CF substrate and the EL substrate prior to joining. FIG. 9B illustrates the joined CF substrate and EL substrate. FIG. 9C illustrates the resin curing process. FIG. 9D illustrates the EL unification process.

Like FIGS. 8A-8D, each of FIGS. 9A-9D includes two drawings on the left-hand and right-hand sides, showing the same part of the process. The left-hand side is a perspective view diagram and the right-hand side is a cross-sectional diagram.

(a) Application Process

The sealant application process involves applying sealant 135a, 135b to the inside and outside of the sealing material 133 along the sealing material 133 formed in a longitudinal loop as seen in a plan view. Here, sealant 135a applied to the outside serves to prevent the intrusion of water, oxygen, and so on into the display region from outside, mainly during the resin curing process and the EL unification process. Also, sealant 135b applied to the inside serves to prevent sealing defects occurring due to intrusion, mainly of the resin material 136, between the sealing material 133 and the EL substrate 11, before the resin material 136 is baked.

The sealant may be any of epoxy resin, acrylic resin, silicone resin, phenol resin, melamine resin, and so on.

The resin material application process involves dripping the resin material 136 onto the display region. The resin material is dropped so as to be evenly distributed.

When the above-described sealant application process and resin material application process are complete, the substrate is as illustrated by the CF substrate 12a of FIG. 9A.

(b) Joining Process

As shown in FIGS. 9A and 9B, the joining process involves joining the CF substrate 12a resulting from the above-described application process with the EL substrate 11a resulting from the EL preparation process, such that the EL elements 30a of the EL substrate 11a and the colour filters 122a of the CF substrate 12a face each other.

(c) Decompression Process

The decompression process is decompression applied to the joine substrates. Decompression removes (i.e., enables the outgassing of) air (i.e., gas) in the resin material, air between the contact surfaces of the sealant 135 and the CF substrate 12a, and gasses built up during the baking of the frit paste 130. In order to improve the effect of escape, the CF substrate 12a may be decompressed alone prior to joining with the EL substrate 11a.

Here, the decompression process is performed after the joining process. However, the EL substrate 11a and the CF substrate 12a may undergo joining after decompression, and the resin material may be applied to the CF substrate 12a after decompression.

(d) Resin Curing Process

The resin curing process involves curing the resin material 136 between the EL substrate 11a and the CF substrate 12a. As shown in FIG. 9C, the curing method uses heat and ultraviolet rays. Once cured, the resin material forms the sealing resin 139.

(e) EL Unification Process

The EL unification process involves fusing the sealing material 133 and unifying the melted sealing material 133 with the EL substrate 11a. Specifically, this is performed when the sealing material 133 is baked. The baking process is performed with the laser 137, as shown in FIG. 9D.

Accordingly, the display region 131 is sealed by the sealing material 133, such that the sealing material in this state has become the sealing member (133).

An intermediate panel 138 is produced by the EL substrate 11a and the CF substrate 12a joined to each other via the sealing member 133 and so on.

(4) Cutting Process

The cutting process is performed on the peripheral portions of the intermediate panel 138. After cutting, the display panel 10 is produced. The cutting is performed by cutting along a rectangular frame 151 of the sealing member 133 in the intermediate panel 138. The cutting may be performed using an implement such as diamond cutter, a laser scribe, or similar. The base line for cutting is a scribed line.

3. Application Process

The details of the application process are described below.

(1) Dispenser Device

Figure 10A:
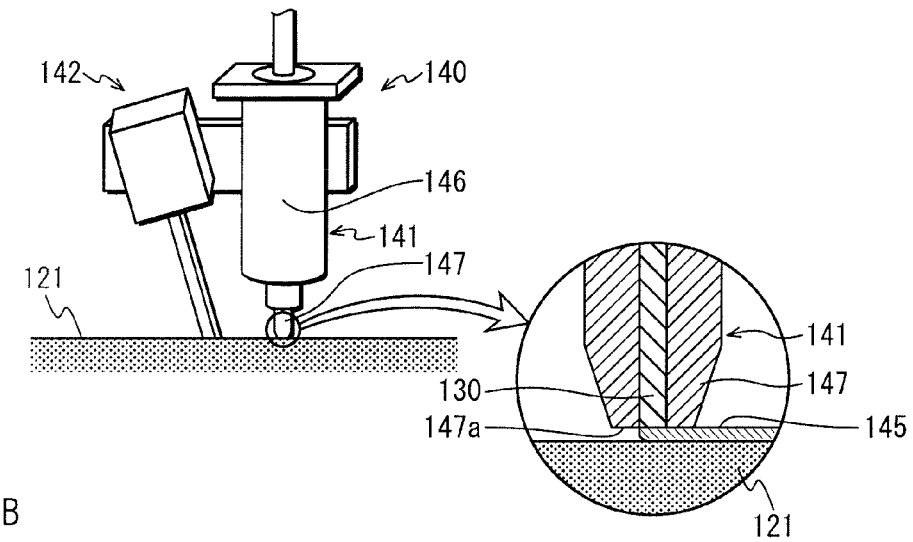
FIGS. 10A-10C illustrate a dispenser device, where
Figure 10B:
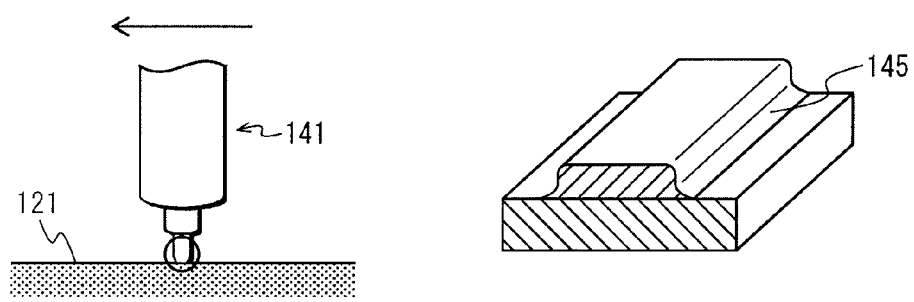
Figure 10C:
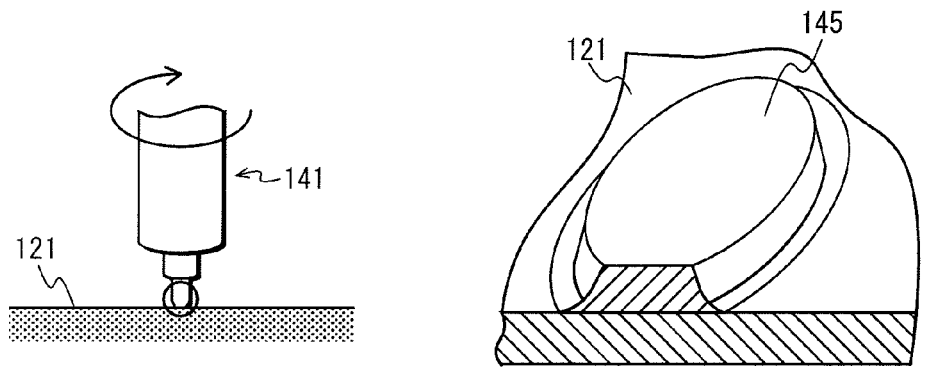

FIGS. 10A-10C illustrate the dispenser device. FIG. 10A is a schematic illustration. FIG. 10B is a perspective view of the frit paste after application when the dispenser device has advanced directly. Similarly, FIG. 10C is a perspective view of the frit paste after application when the dispenser device has advanced rotationally.

The dispenser device 140 includes a discharge unit 141 accumulating and discharging the frit paste 130, a measuring unit 142 measuring the distance from the glass substrate 121, and a (non-diagrammed) control unit controlling the distance between the discharge unit 141 and the glass substrate 121 as measured by the measuring unit 142, and adjusting the amount of frit paste 130 discharged by the discharge unit 141.

In order to distinguish between the frit paste prior to application on the glass substrate 121 and the frit paste after application, reference sign 130 is used for the former and reference sign 145 is used for the latter.

The discharge unit 141 includes a cylinder 146 accumulating the frit paste 130 and a nozzle 147 provided at the bottom of the cylinder 146 and discharging the frit paste 130. The nozzle 147 is continuous with a cylinder chamber within the cylinder 146. The frit paste 130 is discharged by being pressurised within the cylinder chamber.

The measuring unit 142 measures the distance from the glass substrate 121, which is positioned in front of the nozzle 147 relative to an advancement direction. The measurement is performed using a laser displacement sensor. The measured results are output to the control unit.

The control unit controls the pressure applied within the cylinder 146, the movement speed of the discharge unit 141, and the height of the nozzle 147 according to the results measured by the measuring unit 142. The height and width of the frit paste 145 applied to the glass substrate 121 are determined by the pressure, the movement speed, and the nozzle height.

In the present Embodiment, as shown in the magnified portion of FIG. 10A, the control unit diminishes and maintains the distance between the glass substrate 121 and a bottom face 147a of the nozzle 147, and maintains the pressure in the cylinder 146 (i.e., the amount of discharged frit paste 130). Here, the height of the applied frit paste 145 is determined according to the space between the nozzle 147 and the glass substrate 121.

As such, when the dispenser device 140 advances linearly as shown in FIG. 10B, the frit paste 145 dispensed onto the glass substrate 121 forms a straight line portion that is flat of uniform height and width.

Also, when the dispenser device 140 advances rotationally as shown in FIG. 10C, the frit paste 145 dispensed on the glass substrate 121 forms a flat disc of uniform height and width.

(2) Frit Paste Application Shape

Figure 11A:
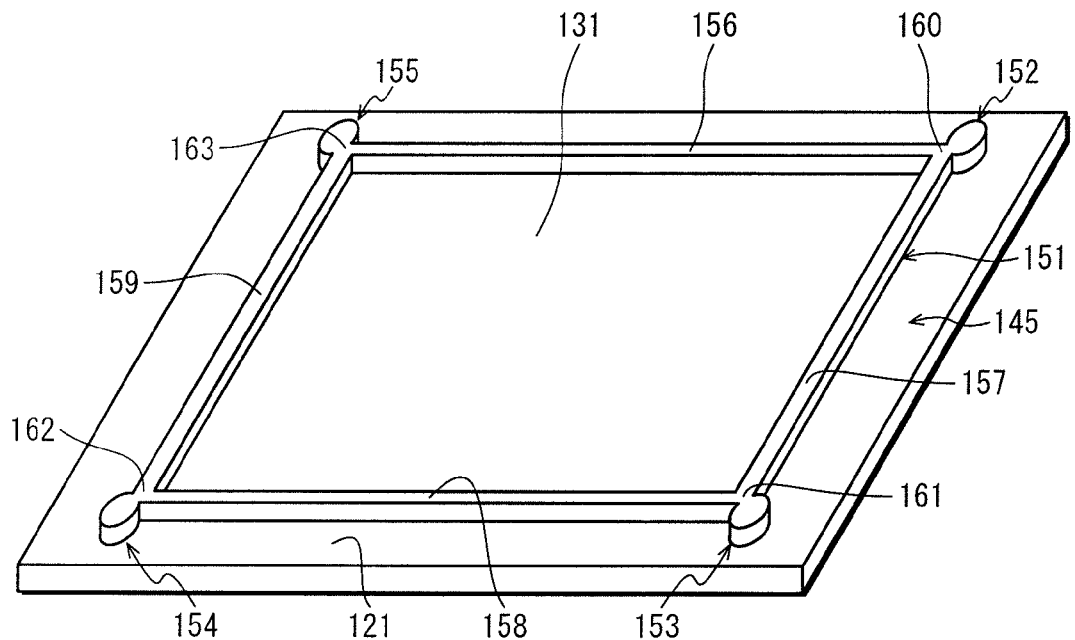
FIGS. 11A and 11B are schematic diagrams of the frit paste as applied, where
Figure 11B:
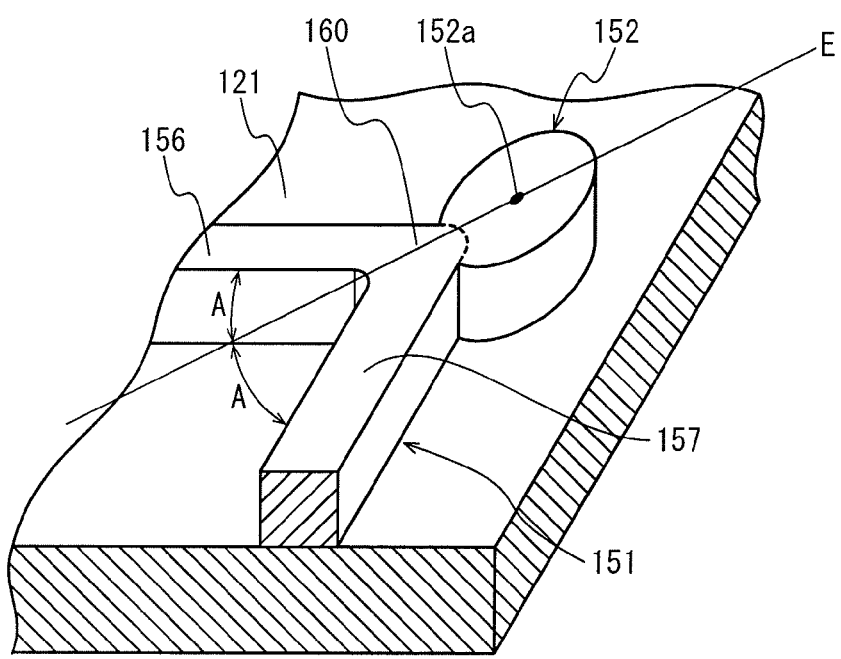

FIGS. 11A and 11B are schematic diagrams of the frit paste as applied, where FIG. 11A is a perspective view and FIG. 11B is a magnified view of the vicinity of a corner of the rectangular frame.

As shown in FIG. 11, the frit paste 130 is applied so as to form the rectangular frame 151 and a plurality (in this example, four) reinforced portions 152, 153, 154, and 155 (hereinafter, reinforced portions 152-155). That is, the frit paste 145 is applied to become the rectangular frame 151 and the reinforced portions 152-155.

(2-1) Rectangular Frame

The rectangular frame 151 surrounds the rectangular display region 131 (corresponding to the colour filter 122) where the light-emitting elements are formed, and is rectangular as seen in a plan view. The rectangular frame 151 is configured from four edge portions, including a pair of long edge portions 156 and 158 extending along the longer dimension of the display region 131, and a pair of short edge portions 157 and 159 extending along the shorter dimension of the display region 131. Where no distinction between long and short edge portions is required, the edge portions are collectively referred to as edge portions 156-159.

(2-2) Reinforced Portions

The reinforced portions 152-155 are provided on the outside of corner portions 160-163 of the rectangular frame 151, so as to be continuous with the corner portions 160-163. In other words, the reinforced portions 152-155 protrude outwardly from the corner portions 160-163 of the rectangular frame 151. As seen in a plan view, the reinforced portions 152-155 are round and partially overlap (at a base portion) the corner portions 160-163 of the rectangular frame 151.

As shown in FIG. 11B, the reinforced portions 152-155 are each arranged along a line E that bisects the internal angle of the corresponding corner portion of the rectangular frame 151. In the present Embodiment, the center of each reinforced portion 152-155 (note that FIG. 11B shows only center 152a reinforced portion 152) is located along the line E bisecting the corresponding corner.

The reinforced portions 152-155 are continuous with the corresponding corner portions 160-163 of the rectangular frame 151, and do not protrude inwardly toward the interior of the rectangular frame 151. The reinforced portions 152-155 are formed with a greater curvature, and the portions connecting the reinforced portion 152-155 to the rectangular frame 151 are more smoothly linked, thus being beneficial in reducing stresses.

(3) Application Method

Figure 12A:
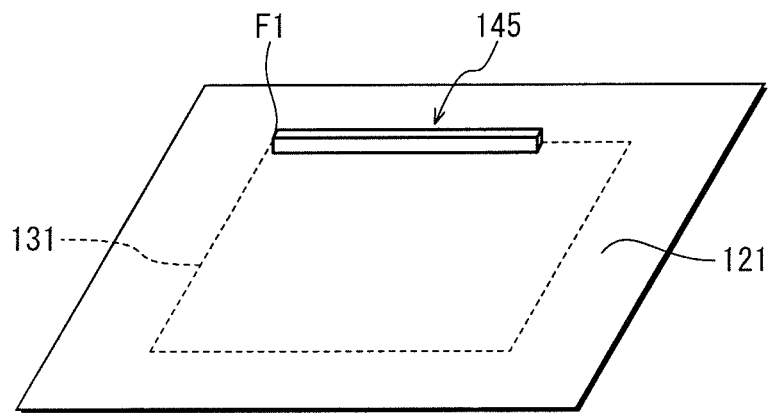
FIGS. 12A-12C illustrate a frit paste application method, where
Figure 12B:
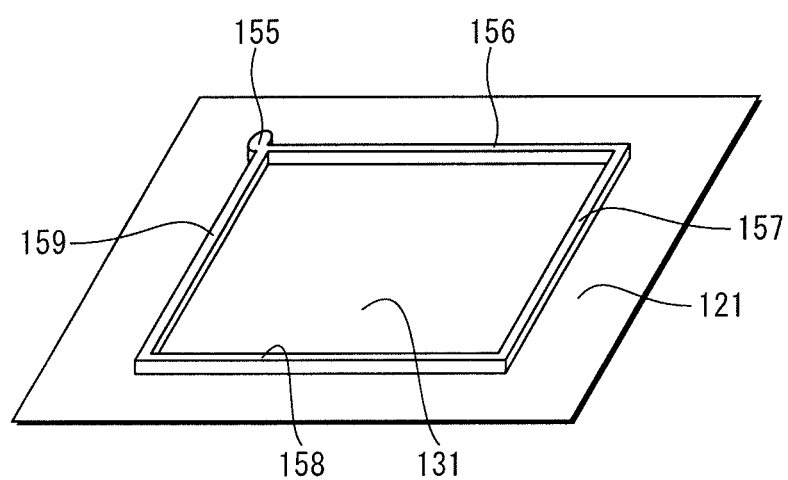
Figure 12C:
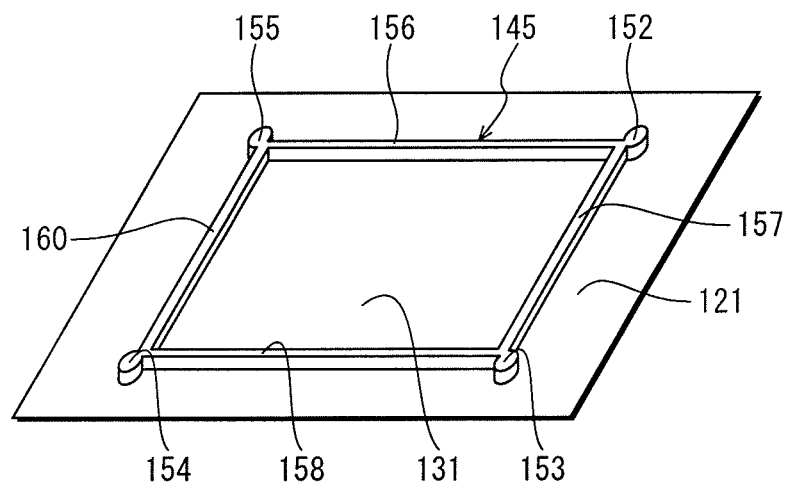

FIGS. 12A-12C illustrate the frit paste application process. FIG. 12A illustrates the beginning of application. FIG. 12B illustrates a stage where one reinforced portion has been formed. FIG. 12C illustrates the completed frit paste application.

This application method is intended as an example, and no particular limitation is intended to the application method for the frit paste 145 having the rectangular frame 151 and the reinforced portions 152-155.

The application of the frit paste 130 onto the glass substrate 121 begins as shown in FIG. 12A, from a position F on border line 131a of the display region 131. The position F where application starts is the intersection of a planned position for long edge portion 156 and a planned position for short edge portion 159 (i.e., corner portion 163). Application of the frit paste 130 begins from position F and extends in a straight line along the border line 131a on the display region 131, to form (arrange) the long edge portion 156.

Eventually, upon reaching a planned position for short edge portion 157 (also the planned position for corner portion 160), the direction of movement changes by 90° and continues, going to advance and rotate until finally forming (arranging) reinforced portion 155.

Next, the remaining reinforced portions 152-154, which are round as seen in the plan view, are formed sequentially at the corner portions 160-162 of the rectangular frame 151 so as to connect to the corresponding corner portions 160-162. FIG. 12B shows reinforced portion 155 formed at the corner portion.

As shown in FIGS. 10A-10C, the reinforced portions 152-155 are formed by moving the dispenser device 140 to each reinforced portion formation position and rotating while dispensing the frit paste 130 (or by dispensing the frit paste 130 while rotating).

As shown in FIG. 12B, once reinforced portion 155 is formed, the dispenser device 140 is moved to the next reinforced portion formation position to form the other reinforced portions 152-154. The application of the frit paste 145 onto the glass substrate 121 is then complete, as shown in FIG. 12C.

Upon formation, the reinforced portions 152-155 will overlap (i.e., mix with) the corner portions 160-163 of the rectangular frame 151. However, given that the spacing between the nozzle 147 and the glass substrate 121 is fixed, this has the result of forming a rectangular frame 151 and reinforced portions 152-155 having a uniform height.

4. Cutting Process

Figure 13:
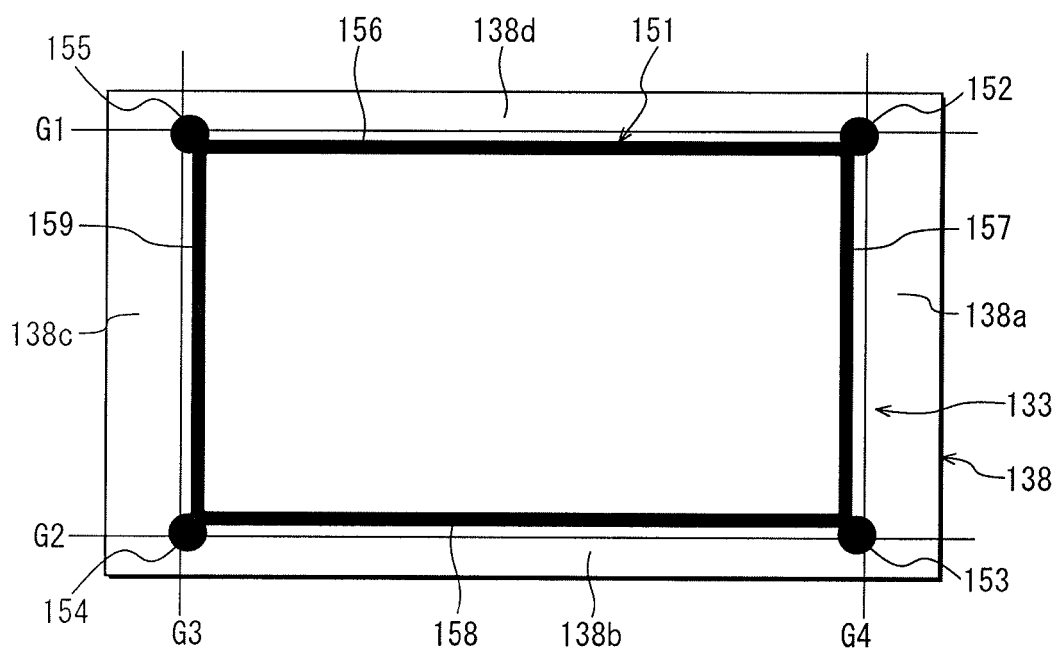
FIG. 13 illustrates a cutting process.

FIG. 13 illustrates the cutting process.

As shown in FIG. 13, the cutting process is performed on the peripheral portions of the intermediate panel 138. FIG. 13 is a plan view of the intermediate panel 138. Normally, the sealing member 133 would not be visible, but has been bolded here for convenience of explanation. Also, the rectangular frame 151 and the reinforced portions 152-155 of the sealing member 133 use the same reference signs after baking.

As shown in FIG. 13, the cutting process involves cutting off the peripheral portions 138a-138d of the intermediate panel 138. Once the peripheral portions 138a-138d have been cut off, the resulting dimensions are those of the display panel 10. As shown in FIG. 13, the cutting process is performed along scribed lines G1, G2, G3, and G4 (hereinafter, scribed lines G1-G4) each extending in parallel to one of the edge portions 156-159 making up the rectangular frame 151 of the sealing member 133, with predetermined spacing therefrom.

The spacing between the scribed lines G1-G4 and the edge portions is such that a piece of each reinforced portion 152-155 remains. That is, the scribed lines G1-G4 passes through the reinforced portions 152-155 such that the diamond cutter or laser scribe crosses the reinforced portions 152-155.

The size of the reinforced portions and the positions of the scribed lines G1-G4 are determined such that the intersections of the scribed lines G1-G4 occur within the reinforced portions 152-155. No particular limitation is intended to the order in which cutting is performed along the scribed lines G1-G4.

5. Strain Distribution

FIGS. 22A-22E illustrate strains in the sealing member.

FIGS. 22A-22E illustrate the intermediate panel prior to cutting according to conventional technology. FIG. 22A illustrates a case where the radius of the corner portions of the rectangular sealing member has been increased. FIG. 22B illustrates a case where the radius of the corner portions of the rectangular sealing member has been decreased. FIG. 22C is a magnified view of the common edge portions from FIGS. 22A and 22B. FIG. 22D is a magnified view of a corner portion from FIG. 22A. FIG. 22E is a magnified view of a corner portion from FIG. 22B.

FIG. 22A, in which the radius of the corner portions has been increased, and 22B, in which the radius of the corner portions has been decreased, are described first. The illustrated sealing members 905 and 911 are arranged between an EL substrate and a CF substrate and should have been drawn in dashed lines. However, solid lines are used in order to better illustrate the regions of the sealing members 905 and 911 and the perimeter thereof where stress and residual strain occurs.

In FIGS. 22C-22E, the arrows pointing toward the interior of the rectangular sealing members 905 and 911 represent residual stress in the substrate from the baking of the sealing members 905 and 911. This remaining stress is a tensile stress pulling in the direction of the arrow. Also, regions 909 and 915, drawn as an oval and circle respectively, indicate regions where strain remains.

The display region 903 is typically rectangular. Thus, the sealing member 905 is arranged rectangularly in conformity with the display region 903, and the corner portions have a large-radius arc as shown in FIG. 22A. Here, the portions of the sealing members 905 and 911 corresponding to corner portions of the display region 903 are identified as corner portions 907 and 913.

Making corner portion 907 into an arc with a large radius of curvature serves to prevent fractures (i.e., decreases in manufacturing efficiency) of the substrates upon cutting the periphery of the substrates that are joined together, occurring due to residual stress from the baking of the sealing member 905.

Fractures in the glass substrate are described next.

Fractures in the glass occur when pressure is applied that exceeds the bonding force between the atoms of the glass material. Generally, glass material is resistant to compression stress but vulnerable to tensile stress. On an atomic level, the surface of the glass substrate has innumerable cracks. When the surface of the substrate experiences an outside physical force while the glass substrate is under tensile stress, moments of force are produced centered on the cracks, the outside force is concentrated on the cracks and causes them to expand, such that the cracks extend and fractures visible to the eye are produced in the glass substrate. Furthermore, substrate fractures are more likely to occur when intersecting tensile stresses are applied in two directions, rather than when tensile stress is applied in only one direction. When tensile stresses are applied in two directions, torsional stress occurs at the intersection thereof. Cracks are prone to extending from that point.

When the linear expansion coefficients of the sealing material and the glass substrate are not perfectly matched, then upon returning to room temperature after baking the sealing material, the tensile stresses on the glass substrate in the direction of the arrows continue to act as residual stresses. Among these residual stresses, as shown in FIG. 22C, the tensile stresses on edge portion 908 of the rectangle are unidirectional, acting orthogonally to the edge portion 908.

Also, in the vicinity of corner portion 913, when the corner is nearly a right angle as shown in FIG. 22B, the stresses acting on the corner portion 913 are as illustrated in FIG. 22E. Specifically, torsional stress occurs due to the tensile stresses acting in two directions, orthogonal to the respective edge portions 914a and 914b. As such, stresses are concentrated in the outer area near corner portion 911, and the probability of the substrate fracturing at that location greatly increases. Specifically, a problem may occur when outside force is applied during the scribing process, in that the EL substrate or the CF substrate may fracture in an unexpected direction at the corners of the intermediate panel 910.

In contrast, for corner portion 907 of the sealing member 905, when the corner is curved as shown in FIG. 22A, the direction of stress acting on the corner portion 907 changes gradually, as illustrated in FIG. 22D. Thus, torsional stress from two directions is less likely to occur, the tensile stresses are weaker than those acting on the right-angle corner portion 913 shown in FIG. 22B, and the probability of substrate fracture is reduced.

The above-described technology for arranging the sealing member 905 to have corner portions with a high radius of curvature in the display region 903 (i.e., FIG. 22A) is not amenable to reducing the width of the frame. According to conventional technology, a sealing member (911) with a corner portion (913) of the small radius shown in FIG. 22B and amenable to reducing the width of the frame has the scribed lines F1-F4 pass through region 915 where residual strain occurs, and is likely to fracture when the peripheral portions of the intermediate panel 910 are cut.

FIGS. 14A-14E illustrate the relationship between strain positions and scribed lines. FIG. 14A illustrates the intermediate panel pertaining to the present Embodiment. FIG. 14B illustrates a conventional intermediate panel. FIG. 14C is a magnified view of portions common to FIGS. 14A and 14B. FIG. 14D is a magnified view of a corner portion in FIG. 14A. FIG. 14E is a magnified view is a magnified view of a corner portion in FIG. 14B.

FIGS. 14A and 14B are a plan view of the respective intermediate panels 138 and 910. Normally, the sealing members 133 and 911 would not be visible, but have been bolded for convenience of explanation. Much like in FIGS. 22A-22E, the arrows indicate the orientation of the residual stresses.

The intermediate panels 138 and 910 are respectively subject to the stresses shown in FIGS. 14D and 14E.

(1) Residual Strain

As shown in FIG. 14B, edge portion 914 of the rectangular frame of the sealing member 911 is subject to stresses as shown in FIG. 14C, oriented toward edge portion 914 from both sides. Accordingly, stresses on each side cancel each other out, such that no region is subject to strong residual stresses and residual strain is unlikely to occur.

In contrast, corner portion 913 of the rectangular frame has a point where the tensile stresses operating perpendicularly to the edge portion 914 intersect, as shown in FIG. 14E. Accordingly, torsional stress is prone to occurring due to the tensile stresses in two directions, such that stress is concentrated at this point. Thus, stronger tensile stress occurs in region 915 outside corner portion 913. Given that stress is collected on the inside of corner portion 913, compression stress occurs but torsional stress is unlikely.

As shown in FIGS. 14A and 14D, intermediate panel 138 of the present Embodiment has reinforced portions 152-155, which are round as seen in a plan view, formed at the corner portions 160-163 where residual stresses are likely to be concentrated. Thus, stress (and strain) occurs in the regions 164-167 outside the reinforced portions 152-155.

The reinforced portions 152-155 are formed so as to extend outside the corner portions 160-163 of the rectangular frame 151, being shaped as circles with relatively large curvature as seen in a plan view. As such, regions 164-167 in the vicinity of the reinforced portions 152-155 serve to disperse the residual strain, as shown in FIG. 14D, and reduce the magnitude of stress per unit area.

The conventional intermediate panel 910 has, as shown in FIG. 14B, the rectangular sealing member 911 with corner portion 913 that is nearly a right angle. As such, the shape transition of corner portion 913 is sudden and dramatic. As shown in FIG. 14E, greater residual strain occurs in region 915 outside corner 913 than in regions 164-167 outside the reinforced portions 152-155 of the present Embodiment.

(2) Scribed Lines

The scribed lines G1-G4 on the intermediate panel 138 pertaining to the present Embodiment intersect the reinforced portions 152-155 as shown in FIG. 14A. Here, as shown in FIG. 14D, the scribed lines G1-G4 extend so as to avoid the respective centers of the regions 164-167 outside the reinforced portions 152-155 where residual strain occurs, thus preventing fracture of the intermediate panel 138 due to the residual strain.

Furthermore, the intermediate panel 138 pertaining to the present Embodiment experiences residual strain that is weaker than the residual strain occurring at corner portion 913 of the conventional intermediate panel 910, thus providing additional protection against intermediate panel fracture.

In contrast, as shown in FIG. 14B, the scribed lines H1-H4 of the conventional intermediate panel 910 pass through the region 915 outside the corner portion 913 where residual strain occurs. As such, residual strain is likely to cause fracturing of the intermediate panel 910.

Furthermore, the conventional intermediate panel 910 is subject to residual strain that is stronger than the residual strain dispersed throughout region 164 by the reinforced portion 152 of the intermediate panel 138 pertaining to the present Embodiment, thus becoming more prone to fracturing.

6. Multipanel Method

An example is described above in which one display panel 10 is manufactured from one intermediate panel 138. However, the above-described example is also applicable to manufacturing a plurality of display panels 10 from a large intermediate panel containing a plurality of smaller intermediate panels (hereinafter termed a multipanel method). An example of the multipanel method is described below.

Figure 15:
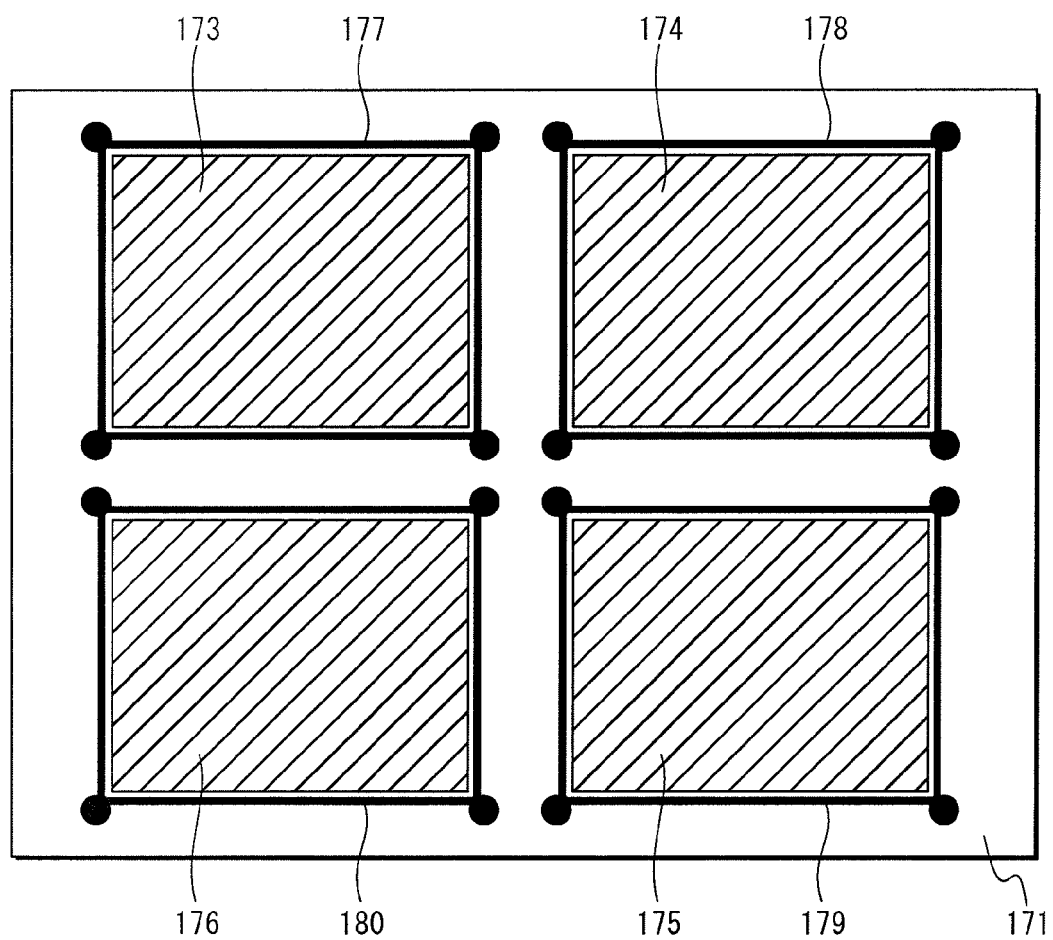
FIG. 15 illustrates an example of frit paste application in a multipanel method for display panels.

FIG. 15 illustrates an example of frit paste application in the multipanel method for display panels.

As shown in FIG. 15, a large plate 171 is a glass substrate having four display regions 173, 174, 175, and 176 formed thereon. The four display regions are arranged in a matrix (here, a 2×2 matrix). The display regions 173-176 are referred to collectively where there is no need to distinguish between individual display regions.

Frit paste 177-180 is applied to the large plate 171 in the display regions 173-176. The frit paste 177-180 is applied so as to surround the display regions 173-176 with a rectangular frame, and to form the reinforced portions at the outside of the corner portions of each rectangular frame.

The cutting process of cutting out the four intermediate panels from a large intermediate panel formed by joining the large plate 171 to another large plate serving as an EL substrate on which are formed pixels corresponding to the four display regions is performed by cutting through the reinforced portions of each intermediate panel, as described for the single-panel example above.

Embodiment 2

As shown in FIG. 13, Embodiment 1 describes cutting the EL substrate and the CF substrate to identical dimensions. That is, the cut face (i.e., side face) of the EL substrate and the cut face (i.e., side face) of the CF substrate are cut so as to match along the entire respective perimeters thereof.

However, the EL substrate and the CF substrate may differ in terms of dimensions. Embodiment 2 describes an example of such a case (i.e., where the cut faces do not match).

1. Mono-Panel Method

Figure 16A:
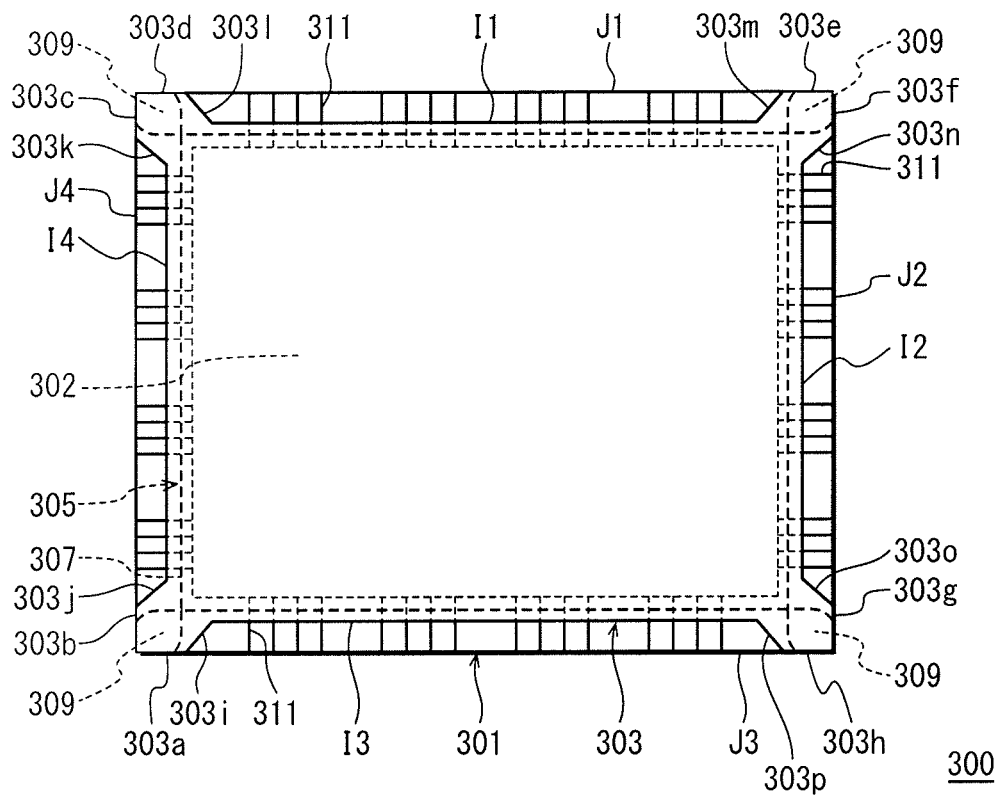
FIGS. 16A and 16B illustrate an example pertaining to Embodiment 2 in which the display panel has substrates of different dimensions, FIG. 16A being a plan view and FIG. 16B being a magnified view of a corner.
Figure 16B:
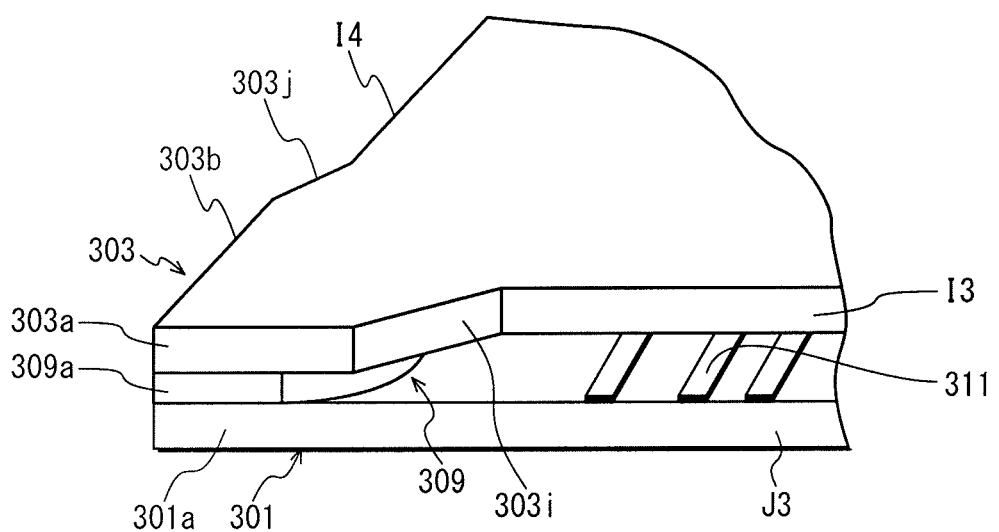

FIGS. 16A and 16B illustrate an example pertaining to Embodiment 2 in which the display panel has substrates of different dimensions. FIG. 16A is a plan view of the display panel and FIG. 16B is a magnified perspective view of a corner of the intermediate panel.

(1) Overview

A display panel 300 has a display region 302 sealed by a sealing member 305 when an EL substrate 301 and a CF substrate 303 are joined to each other. As indicated by the dashed line in FIG. 16A, the sealing member 305 has a rectangular frame 307 and four reinforced portions 309. The reinforced portions 309 extend from the corner portions of the rectangular frame 307 toward the outside.

In terms of overall rectangular shape in a plan view, the EL substrate 301 and the CF substrate 303 are cut such that, as shown in FIG. 16B, side face 309a of one of the reinforced portions 309 is aligned with respective side face 301a of the EL substrate 301 and side face 303a of the CF substrate 303. That is, one of the reinforced portions 309 has side face 309a cut so as to be flush with side faces 301a and 303a at the respective corner portions of the EL substrate 301 and the CF substrate 303. Being flush signifies that at least two faces are included within the same virtual plane.

As shown in FIG. 16A, the reinforced portions 309 have not only side face 309a but also side faces 303b-303h match the side faces of EL substrate 310 and CF substrate 303 at the respective corner portions.

EL substrate 301 is rectangular as seen in the plan view, and has side faces J1-J4. The CF substrate 303 has an overall shape that is rectangular as seen in the plan view. Side faces I1-I4 of the CF substrate 303 each have at least one part (between two neighbouring corner portions at the outer perimeter of the rectangle) that, in the plan view, is arranged inwardly (i.e., closer to the center) relative to a line extending from side portions 303a-303h of the corner portions of the CF substrate 303. That is, side faces I1-I4 each have a portion between two corner portions that is more indented toward the center of the CF substrate 202 than side portions 303a-303h of the CF substrate 303 and the side faces of the EL substrate 301, with respect to the reinforced portions 309.

Also, at least part (between two neighbouring corner portions at the outer perimeter of the rectangle) of side faces I1-I4 of the CF substrate are arranged closer to the centers of the CF substrate 303 and the EL substrate 301 than side faces J1-J4 of the EL substrate 301.

Electrodes 311 for providing an electrical connection to the outside are formed outside the edges of the rectangular frame 307 of the sealing member 305 on the face of the EL substrate 301 opposite the CF substrate 303. The electrodes 31 are exposed due to the two neighbouring corner portions in the circumferential direction of the CF substrate being indented toward the center.

(2) CF Substrate Shape

As shown in FIG. 16A, the CF substrate 303 has side faces 303i-303p that extend toward the display region 302 from the outside of the rectangular frame 307 of the sealing member 305, at the corner portions.

Conventionally, the scribed lines are formed so as to extend toward the display region of the display panel and cutting of the CF substrate and the EL substrate is not performed along these scribed lines. This is done because forming the scribed marks on the substrate using a diamond scribe is prone to causing fissures in the substrate along the direction in which the scribed marks were drawn. In recent years, particularly, with an aim to decreasing costs and creating lighter products, a trend has emerged toward using thinner glass for the CF substrate and so on, which means that the substrates are more likely to fracture.

However, in Embodiment 2, a conventional diamond scriber is not used to cut the CF substrate 303. A diamond cutter or laser scriber is used instead, so as to constrain the risk of fissures occurring in the substrate when the scribe marks are formed. As such, Embodiment 2 enables cutting of the CF substrate 303 having side faces 303i-303p oriented toward the display region 302, and is applicable to thinning the substrate.

(3) Fixing Material

A fixing material is used to fix the EL substrate 301 and the CF substrate 303 so as to achieve more secure joining thereof. For example, the fixing material may be used in the manufacturing process of curing the resin material 136 disposed between the EL substrate 301 and the CF substrate 303, and may be contained within the display device along with the display panel 300, when mounted.

Figure 17A:
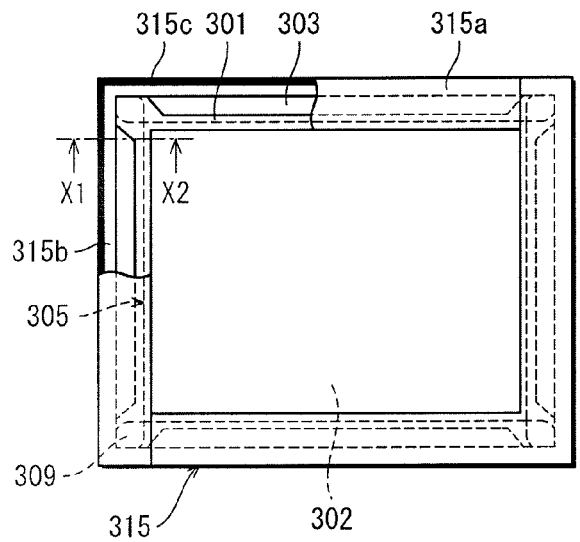
FIGS. 17A-17D illustrate the use of fixing material to join the EL substrate to the colour filter substrate, where
Figure 17B:
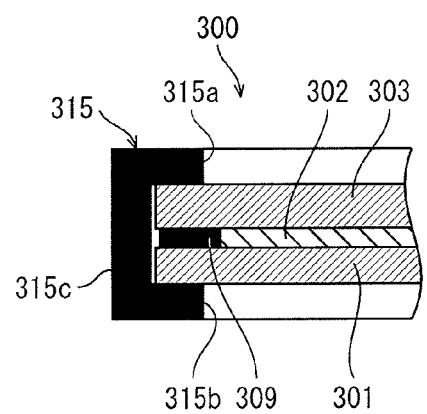
Figure 17C:
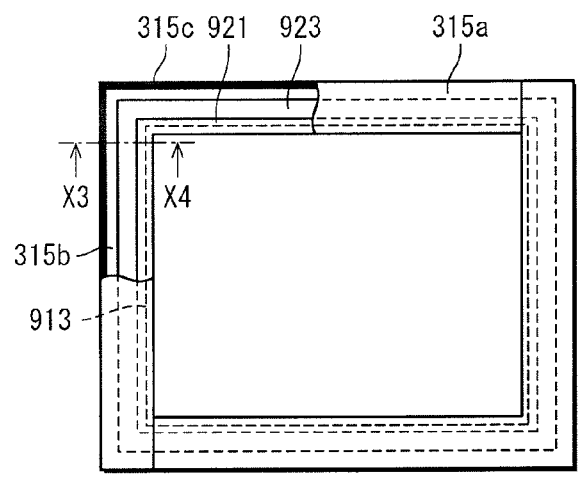
Figure 17D:
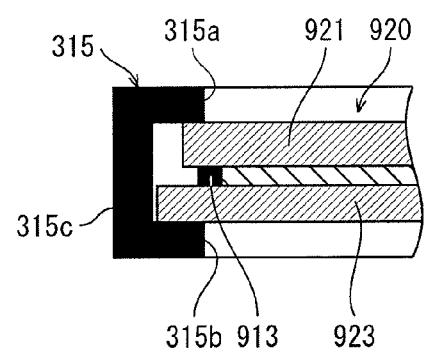

FIGS. 17A-17D illustrate the use of the fixing material to join the EL substrate to the CF substrate. FIG. 17A illustrates a case where the display panel pertaining to Embodiment 2 is used. FIG. 17B is an expanded view of a cross-section of FIG. 17A taken along line X1-X2. FIG. 17C illustrates a case where a conventional display panel is used. FIG. 17D is an expanded view of a cross-section of FIG. 17C taken along line X3-X4.

FIGS. 17A and 17C are front views of the respective display panels, with a portion of the fixing material taken away.

In this example, a frame 315 is used for the fixing material. The frame 315 is made up of two members dividing the frame area into at least two portions as seen in the plan view, so as to enabling mounting of the four sides of the rectangular display panel 300.

As shown in FIGS. 17A and 17C, the frame 315 includes a pair of plate portions 315a and 315b extending along the front and back faces of the display panel 300, leaving a gap corresponding to the thickness of the display panel, and a connecting portion 315c connecting the ends (i.e., on the outside of the display panel 300) of the pair of plate portions 315a and 315b. A lateral cross-section of the frame 315 includes a U-shaped opening in the side of the display panel 300.

The pair of plate portions 315a and 315b are made from an elastically deformable material. Also, the spacing of the pair of plate portions 315a and 315b grows increasingly narrower toward the far ends (i.e., with distance from the center of the display panel 300). Accordingly, when the peripheral portions of the display panel 300 are inserted between the pair of plate portions 315a and 315b, a load is imposed in the thickness dimension of the EL substrate 301 and the CF substrate 303 that acts to maintain the joining thereof.

FIGS. 17C and 17D illustrate a situation where the frame 315 is fitted into a conventional display panel 920. As shown in FIG. 17C, display panel 920 is configured such that CF substrate 921 is smaller than EL substrate 923 when the CF substrate 921 is arranged over the EL substrate 923 and seen in a plan view.

Thus, as seen in FIG. 17D, when the frame 315 is mounted on the display panel 920, the contact surface area between plate portion 315a and CF substrate 921 is smaller and the compression stress acting on the peripheral portions of the CF substrate 921 is greater, which makes the peripheral portions more prone to breaking.

Also, when the display panel 920 is placed between the pair of plate portions 315a and 315b, the position of the sealing member 913 is such that the positions of plate portion 315a near the CF substrate 921, CF substrate 921, the sealing member 913, EL substrate 923, and plate portion 315b near the EL substrate 923 are directly aligned.

However, the peripheral portions of EL substrate 923 protrude from the sealing member 913 toward the exterior. When these protruding portions are subjected a compression load from plate portion 315b, the peripheral portions of EL substrate 923 begin to bend. This deformation poses a risk that the CF substrate 921 and the sealing member 913, or the EL substrate 923 and the sealing member 913, may peel apart.

Next, the mounting of the frame 315 onto the display panel 300 pertaining to Embodiment 2 is described with reference to FIGS. 17A and 17B. The display panel 300 has been cut at the corner portions to match the dimensions of the CF substrate 303 and the EL substrate 301. The reinforced portions 309 of the sealing member 305 are located between the corner portions of the CF substrate 303 and the EL substrate 301.

Accordingly, as seen in a lateral cross-section, the positions of plate portion 315a near the CF substrate 303, CF substrate 303, the reinforced portion 309, EL substrate 301, and plate portion 315b near the EL substrate 301 are directly aligned. Thus, although the pair of plate portions 315a and 315b sandwich the display panel 300 by applying a strong force, the corner portions withstand the load such that the EL substrate 301 and the CF substrate 303 undergo less bending at the middle portions of the edges thereof. Accordingly, bending and deformation of the CF substrate 303 and the EL substrate 301 are constrainable, with the result that the CF substrate 303 and the EL substrate 301 are prevented from peeling apart.

In the event that cracks occur at the corner portions of the CF substrate 303, the reinforced portions 309 serve to fix the CF substrate 303 such that the CF substrate 303 is unlikely to undergo further deformation, thereby constraining the further spread of the cracks.

Also, the corner portions have the reinforced portions 309 of the sealing member 305 covering a wide area of the EL substrate 301 and the CF substrate 303, such that the bending load on the periphery of the EL substrate 301 and the CF substrate 303 is reduced. Accordingly, the reinforced portions 309 are unlikely to peel apart from the CF substrate 303 and the EL substrate 301.

Further, the corner portions of the display panel 300 are prone to receiving outside forces during the manufacturing process, and are thus likely to break. As such, reinforcing the corner portions of the display panel 300 is important, in terms of manufacturing efficiency, for constraining peeling and deformation.

(4) Other

In Embodiment 2, the reinforced portions 309 are formed only at the corner portions of the display panel 300. However, other portions may also be reinforced. A variation of Embodiment 2, in which the reinforced portions are also formed elsewhere, is described below.

Figure 18A:
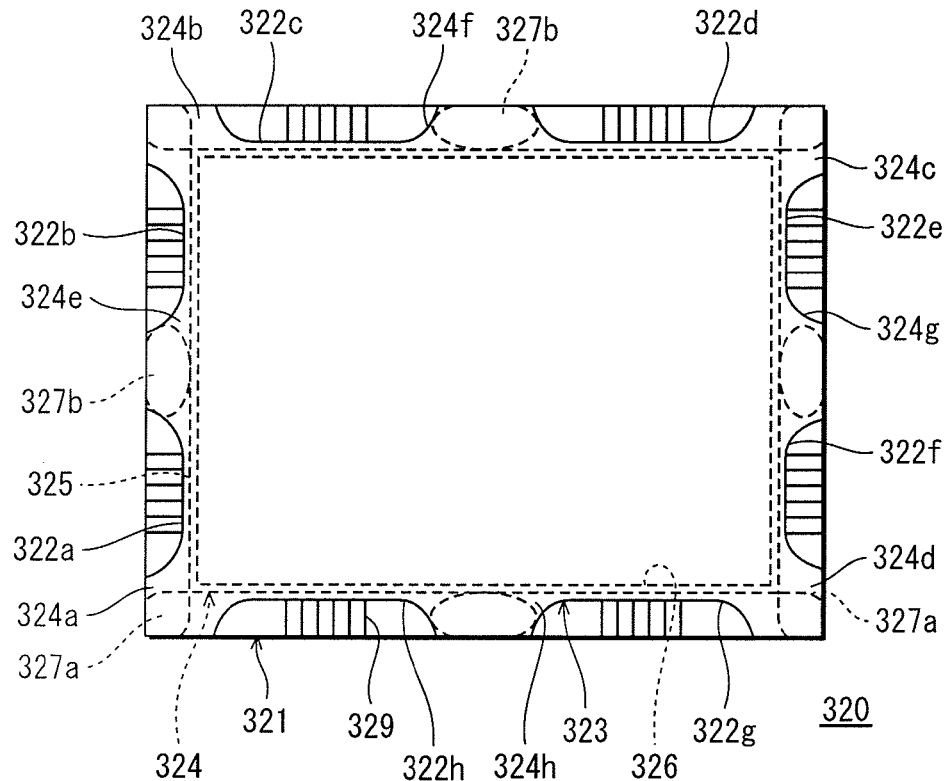
FIGS. 18A and 18B illustrate a variation of Embodiment 2.
Figure 18B:
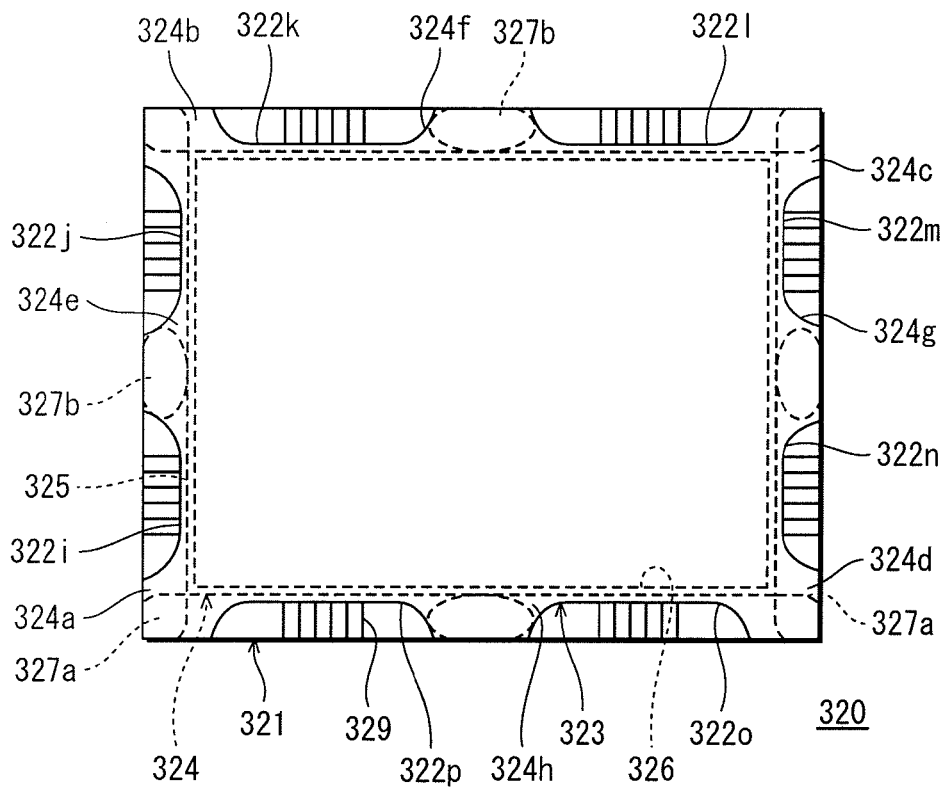

FIGS. 18A and 18B illustrate the variation of Embodiment 2.

As shown, the display panel 320 has the EL substrate 321 and the CF substrate 323 conjoined by the sealing member 324 located therebetween. The sealing member 324 includes a rectangular frame 325 provided along the center of a display region 326, reinforced corner portions 327a provided at the corner portions of the display panel 320, and reinforced middle portions 327b provided at middle portions between the corners.

The reinforced corner portions 327a are configured similarly to the reinforced portions 309 of Embodiment 2. The reinforced middle portions 327b are provided during the sealing material (i.e., frit paste) application process by applying the sealing material at the center of each edge portion of the rectangular frame 325 so as to extend outward, away from the center of the display region 326.

The reinforced middle portions 327b need only be arranged at the outside of the rectangular frame 325, which is the outside of the display region 326. No particular limitation to the shape thereof is intended. In this example, the shape is oval. However, the shape may also be round, oblong, square, or some other polygon.

As shown in FIGS. 18A and 18B, the CF substrate 323 has an overall shape that is rectangular, and includes concavities 322a-322h and 322i-322p at the edges thereof. In other words, the CF substrate 323 has a shape conforming to the sealing member 324. That is, corner portions 324a-324d corresponding to the reinforced corner portions 327a and middle portions 324e-324h corresponding to the reinforced middle portions 327b extend outward further than the corresponding portions of the rectangular frame 325.

The concavities at the edges may by linear concavities at the side faces, as illustrated by concavities 322a-322h in FIG. 18A, or may be curved concavities at the side faces as illustrated by concavities 322i-322p in FIG. 18B.

The EL substrate 321 includes electrodes 329 on faces opposite the CF substrate 323 and corresponding to the concavities 322a-322h and 322i-322p.

The middle portions 324e-324h of the CF substrate 323 are conjoined to the EL substrate 321 via the reinforced middle portions 327b. Accordingly, the display panel 320 has not only the corner portions but also the middle areas between corners acting, via the fixing material (e.g., the frame 315), to fix the EL substrate 321 and the CF substrate 323. Having the reinforced middle portions 327b enables, for example, a reduction in deformation of the substrates between corner portions of the EL substrate 321 and the CF substrate 323.

Although the middle portions 324e-324h are defined as the approximate midpoint between corner portions of the CF substrate 321, other positions are also possible, and the middle portions may also be provided in plurality at each edge. For example, appropriate positioning may be determined according to the design of the display panel 320 and the positions of electrodes or wiring extending from the display region (or display area) 326.

2. Multi-Panel Method

The following describes a multi-panel method using a large intermediate panel 339 as the display panel described above.

Figure 19:
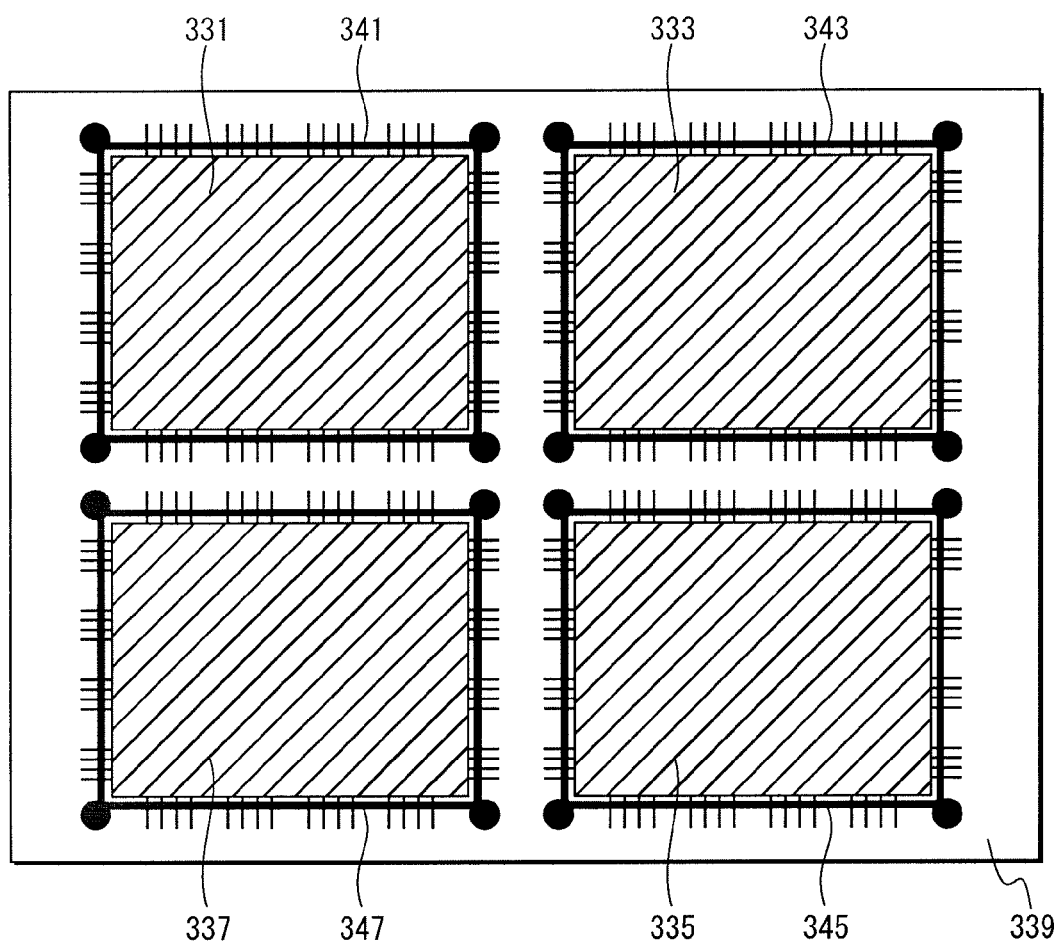
FIG. 19 illustrates a large intermediate panel used for a multi-panel method applied to the display panel.

FIG. 19 illustrates the large intermediate panel used for the multi-panel method applied to the display panel.

FIG. 19 is a plan view of the large intermediate panel. However, the display region and sealing member are drawn in solid lines rather than in dashed lines so as to better illustrate the interior configuration.

As shown, the large intermediate panel 331, as provided when a large EL substrate and a large CF substrate are joined together, includes a plurality (here, four) of display regions 331, 333, 335, 337 (where no distinction between display regions is needed, the display regions are collectively referred to as display regions 331-337).

The display regions 331-337 are sealed by sealing members 341, 343, 345, 347 (where no distinction between sealing members is needed, the sealing members are collectively referred to as sealing members 341-347) disposed therearound. The four display regions are arranged in a matrix (here, a 2×2 matrix).

The frit paste is applied to the substrate so as to surround the display regions 331-337 with a rectangular frame, and to form the reinforced portions at the outside of the corner portions of each rectangular frame. That is, the sealing members 341-347 each include a rectangular frame surrounding the respective display region 331-337, and reinforced portions arranged at the outside of the corner portions of each rectangular frame.

The cutting of the four display panels from the large intermediate panel is described next.

FIGS. 20A-20C illustrate the cutting of the display panels from the large intermediate panel. FIGS. 20A and 20B show the large intermediate panel as seen from the CF substrate, and FIG. 20C shows the large intermediate panel as seen from the EL substrate.

FIGS. 20A-20C are plan view of the large intermediate panel. However, the display region and sealing member are drawn in solid lines rather than in dashed lines so as to better illustrate the interior configuration, such as electrode positions.

Here, the cutting of the display panels is performed using a laser. That is, a laser scribe is used to cut the large intermediate panel while power is being adjusted.

The cutting process includes: an EL perimeter cutting process of cutting the EL substrate 351 along the perimeter of each sealing member 341-347, formed as rectangles in the plan view, so as to pass through each reinforced portion; a CF perimeter cutting process of cutting the CF substrate 353 along the perimeter of each sealing member 341-347, formed as rectangles in the plan view, so as to pass through each reinforced portion; and a CF inter-corner cutting process of cutting the CF substrate 353 so as to form the concavities between each pair of neighbouring corners in the circumferential directions of the respective sealing members. No particular limitation is intended to the order of the above-listed processes. The processes may be performed in the above order, or the alternative below may be used.

(1) CF Perimeter Scribing Process

As shown in FIG. 20A, the CF perimeter cutting involves cutting around the rectangular frame of each sealing member 341-347 so as pass through the reinforced portions disposed around the sealing members 341-347 (the cut face of each reinforced portion corresponding to the second face of the disclosure). Thus, vertical (column direction) and horizontal (row direction) scribed lines (e.g., K1-K6) are first drawn in a matrix, extending between neighbouring display regions, so as to form scribed marks on the surface of the CF substrate 353.

(2) CF Inter-Corner Scribing Process

As shown in FIG. 20B, the CF inter-corner cutting involves cutting the CF substrate 353 along the edges of the sealing members 341-347, which form rectangles on the CF substrate 353. Thus, scribed marks are first formed on the surface of the CF substrate 353 by tracing oblong scribed lines L1-L4 so as to bridge neighbouring display panels in the row direction or in the column direction.

Also, scribed marks are formed on the surface of the CF substrate in portions thereof corresponding to the ends of the rows and columns, as semi-oblong scribed lines L5-L8.

(3) EL Perimeter Scribing Process

As shown in FIG. 20C, the EL perimeter cutting involves cutting around the rectangular frame of each sealing member 341-347 so as to pass through the reinforced portions disposed around the sealing members 341-347 (the cut face of each reinforced portion corresponding to the first face of the disclosure). Thus, vertical (column direction) and horizontal (row direction) scribed lines (e.g., M1-M6) are first drawn in a matrix, extending between neighbouring display regions, so as to form scribed marks on the surface of the EL substrate 351.

(4) Cleavage Process

Mechanical force is applied to the vicinity of the scribed lines drawn in parts (1)-(3), and the CF substrate 353 and the EL substrate 351 are then twisted so as to cause cleavage along the scribed lines of the CF substrate 353 and the EL substrate 351. As for the reinforced portions of the sealing members 341-347, given that the scribed lines (e.g., K1-K6) of the CF substrate 353 and the scribed lines (e.g., M1-M6) of the EL substrate 351 are in the same place, and that in addition, the thickness of the reinforced portions (e.g., 0.01 mm) is sufficiently small in comparison to the thickness of the glass substrate (0.7 mm), cleavage is easily made to occur along identical lines.

<Variations>

1. Manufacturing Method (1) Paste Application Substrate

In the above Embodiments, the frit paste 130 is applied to the glass substrate 121 intended for the CF substrate. However, the application process of the frit paste 130 may also be performed on the substrate intended for the EL substrate. In such a case, the EL elements (i.e., light-emitting elements) may be formed after the unification process of the frit paste.

(2) Application Process

In the Embodiments, the frit paste 130 application is performed using a dispenser method that employs a nozzle. However, a screen printing method employing a screen mask may be used instead.

(3) Frit Paste Unification Process

Although the frit paste unification process is described as using the laser 132 to have the frit in the frit paste 145 adhere to the glass substrate 121, another method may also be used to the same end. Other methods include disposing the glass substrate having the frit paste thereon in a furnace and heating until the temperature reaches the fusion point of the frit paste (i.e., the sealing material), thereby causing the unification of the sealing material and the substrate.

(4) CF Formation Process

The CF formation process is performed after the frit paste unification process. However, when the frit paste unification process is performed via heating using the laser 132, a smaller portion of the glass substrate is subject to heating and the effect of the heat on the colour filters 122*a* is reduced. As such, the CF formation process may be performed before the frit paste unification process with the laser, or before the application process of the frit paste 145.

That is, when the laser is used for fusing the frit paste, the process order may be CF formation, frit paste application, frit paste unification process, or may be frit paste application, CF formation, frit paste unification process.

2. Reinforced Portions (1) Plan View

In the Embodiments, the reinforced portions 152-155 and 309 are formed at the outside of the respective rectangular frames 151 and 307 so as to be connected to the corresponding corner portions of the rectangular frames 151 and 307, the reinforced portions 152-155 and 309 being round as seen in the plan view. However, other configurations are also possible.

Other shapes include oval, oblong, triangular, and other polygonal shapes. In consideration of the changes in residual strain occurring along the perimeter of the different shapes, a round, oval, or oblong shape is preferable. For polygonal shapes, corner portions are beneficially rounded off.

(2) Structure

In the Embodiments, the reinforced portions 152-155 are round and filled in with the frit paste. However, the reinforced portions need only be connected to the corresponding corner portions of the rectangular frame and arranged on the outside thereof. No particular importance is given to the point regarding whether or not the reinforced portions are filled in with the frit paste.

Figure 21A:
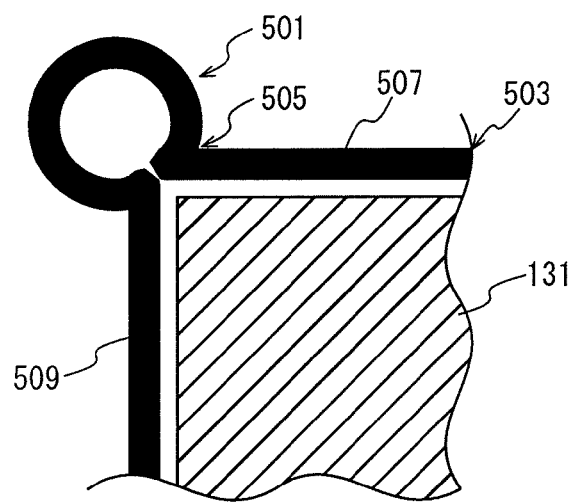
FIGS. 21A-21C illustrate Examples 1-3 of the reinforced portions, where FIG. 21A pertains to Example 1, FIG. 21B pertains to Example 2, and FIG. 21C pertains to Example 3.
Figure 21B:
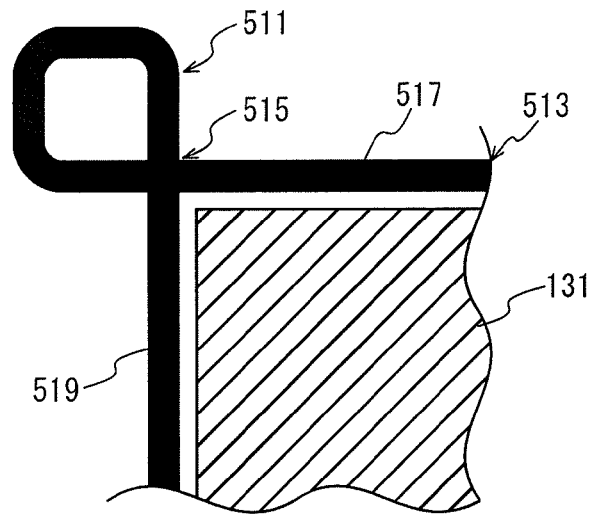
Figure 21C:
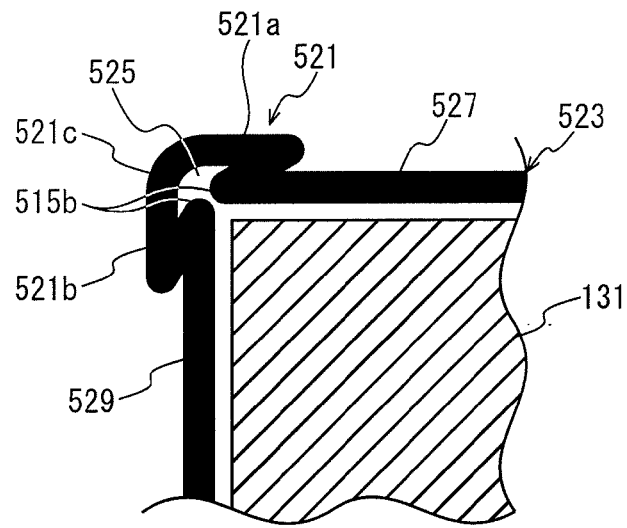

FIGS. 21A-21C illustrate other examples of the reinforced portions labelled Examples 1-3. FIG. 21A illustrates a reinforced portion pertaining to Example 1, FIG. 21B illustrates a reinforced portion pertaining to Example 2, and FIG. 21C illustrates a reinforced portion pertaining to Example 3.

(a) Example 1

As shown in FIG. 21A, reinforced portion 501 pertaining to Example 1 is arranged at the outside of a corner portion 505 of rectangular frame 503 so as to be continuous with the corner portion 505. The reinforced portion 501 is round as seen in the plan view, and the interior thereof is not filled by the frit paste.

The reinforced portion 501 is formed so as to bridge edge portion 507 and edge portion 509, which meet at corner portion 505 of the rectangular frame 503. In other words, the reinforced portion 501 is formed so as to extend from one edge portion of the corner portion 505 (e.g., edge portion 507) and curve in a circle before continuing to the other edge portion (e.g., edge portion 509).

According to this configuration, the frit paste is applied with a single stroke, thus enabling more efficient frit paste application.

(b) Example 2

The reinforced portion 501 of Example 1 is shaped as a circle extending from two edge portions (507, 509) of the corner portion (505). However, other polygonal shapes are also possible. Example 2 illustrates an example of a quadrilateral extending from the corner portion.

As shown in FIG. 21B, reinforced portion 511 pertaining to Example 2 is arranged at the outside of a corner portion 515 of rectangular frame 513 so as to be continuous with two edge portions 517 and 519 that meet at the corner portion 515. The reinforced portion 511 is a quadrilateral as seen in the plan view, extending from edge portion 517, which is one of the two edge portions meeting at the corner portion (515), so as to trace a square before connecting to the other edge portion 519. The square so traced has rounded corners.

(c) Example 3

As shown in FIG. 21C, reinforced portion 521 pertaining to Example 3 is arranged at the outside of a corner portion 525 of rectangular frame 523 so as to be continuous with the corner portion 525. The reinforced portion 521 is angular as seen in the plan view. The reinforced portion 521 includes two connecting portions 521*a* and 521*b* connected to the two edge portions (527, 529) meeting at the corner portion 525 of the rectangular frame 523, and a curved portion 521*c* curving in an arc along the corner portion 525.

When the frit paste of the reinforced portion 521 is applied using the dispenser method, for example, application first proceeds from an end of edge portion 527 at the corner portion 525 toward a midpoint of the edge portion 527 along the outside thereof before returning, and then extending along a straight line conforming to the rectangular frame 523, curving in an arc corresponding to the corner portion 525 upon reaching the corner portion 525 of the rectangular frame 523, extending along the other edge portion 529, and finally returning to the other end of the edge portion 529.

Here, the two edge portions 517 and 519 meeting at the corner portion 515 may be directly connected as in FIG. 21B, or may be somewhat separated as in FIG. 21C.

(3) Positioning

In the Embodiments, the center of each reinforced portion 152-155 is, as shown in FIG. 11B, arranged along line E bisecting the internal angle of the corresponding corner portion of the rectangular frame 151. This is done because arranging the center of the reinforced portion along the bisecting line causes the region where the residual strain from outside the reinforced portion is greatest (portions 164-167 in FIGS. 14A-14E) to occur away from the scribed lines (lines G1-G4 in FIG. 14A), thus preventing breakage of the intermediate panel 138 during the cutting process.

Accordingly, the positioning of the reinforced portions may be any positioning such that the greatest residual stress produced at the outside of the reinforced portions does not occur on the scribed lines, and need not necessarily be such that the center of the reinforced portions is on the bisecting line.

In consideration of the residual strain in the display panel, having the greatest residual stress occur along a diagonal of the rectangular frame is beneficial in terms of balance in the overall strain.

(4) Other

In the Embodiments, all four reinforced portions 152-155 are the same in terms of shape and size. However, this need not necessarily be the case. For example, the reinforced portions along the same diagonal of the rectangular frame may be of the same shape and size, with the shape and size changing for each of the diagonals. Alternatively, each of the reinforced portions may have a different shape and size. However, a sufficient portion of the reinforced portion must be present along the scribed lines.

3. Rectangular Frame

In the Embodiments, the rectangular frame 151 is formed so as to be rounded at the inner sides of the corner portions. However, the inner sides of the corner portions may also be substantially right angles as in Example 2, above, or may be discontinuous as in Example 3, above.

INDUSTRIAL APPLICABILITY

The present disclosure is widely applicable to applying paste to a first substrate.

REFERENCE SIGNS LIST

10 Display panel
11 EL substrate
12 CF substrate
13 Sealing resin layer
145 Frit paste
151 Rectangular frame
152-155 Reinforced portions

The invention claimed is:

1. A display panel, comprising:
a first substrate;
a second substrate arranged opposite the first substrate;
a plurality of electroluminescence elements disposed between the first substrate and the second substrate; and
a sealing member provided between the first substrate and the second substrate, sealing the electroluminescence elements, wherein
the sealing member includes a rectangular frame formed along a perimeter of the electroluminescence elements, and a reinforced portion protruding outward from a corner portion of the rectangular frame,
the reinforced portion includes a first side face cut so as to be flush with at least one corner side face of the first substrate, and a second side face cut so as to be flush with a corresponding corner side face of the second substrate,
the first side face and the second side face are coplanar,
the electroluminescence elements are mounted on the first substrate, and
the second substrate has a side face between two adjacent corners of a periphery of the second substrate that is positioned further toward a second substrate center than side faces at the two adjacent corners.

2. The display panel of claim 1, wherein
an indented portion of the side face of the second substrate is closer to the second substrate center than a side face of the first substrate is to the second substrate center.

3. The display panel of claim 2, wherein
the sealing member is frit glass.

4. The display panel of claim 3, wherein
the sealing member further includes a reinforced middle portion protruding outward from an inter-corner portion of the rectangular frame.

5. The display panel of claim 1, wherein
the sealing member is frit glass.

6. The display panel of claim 1, wherein
the sealing member further includes a reinforced middle portion protruding outward from an inter-corner portion of the rectangular frame.

7. The display panel of claim 1, wherein
the first substrate includes an inner surface that faces the second substrate, and
the side face of the second substrate that is positioned further toward the second substrate center exposes a portion of the inner surface of the first substrate.

8. The display panel of claim 1, wherein
an area of an inner surface of the first substrate facing the second substrate is larger than an area of an inner surface of the second substrate facing the first substrate.

9. The display panel of claim 1, wherein
the side face of the second substrate that is positioned further toward the second substrate center extends perpendicularly between a top surface and a bottom surface of the second substrate, and
the side faces at the two adjacent corners each extend perpendicularly between the top surface and the bottom surface of the second substrate.

10. A manufacturing method for a display panel, comprising:
forming a plurality of electroluminescence elements within a central region of a first substrate;
using a sealing material to provide, on one of the first substrate and a second substrate, a rectangular frame surrounding a region corresponding to the central region and a reinforced portion protruding outward from a corner portion of the rectangular frame;
sealing the electroluminescence elements by joining the first substrate and the second substrate with the sealing material interposed therebetween;
cutting the first substrate and the second substrate, wherein
cutting the first substrate and the second substrate involves cutting the reinforced portion while overlapping with respective corner portions of the first substrate and the second substrate, as viewed from a joining direction, and the second substrate is cut to have a side face between two adjacent corners of a periphery of the second substrate that is positioned further toward a second substrate center than the two adjacent corners.

11. The manufacturing method of claim 10, wherein
the reinforced portion is cut while simultaneously overlapping with both of the respective corner portions of the first substrate and the second substrate, as viewed from the joining direction, such that overlapping portions are flush.

12. The manufacturing method of claim 11, wherein
the second substrate is cut such that a side face thereof is indented toward a second substrate center with respect to a line extending from the corner portion.

13. The manufacturing method of claim 10, wherein
the first substrate includes an inner surface that faces the second substrate, and
the side face of the second substrate that is positioned further toward the second substrate center exposes a portion of the inner surface of the first substrate.

14. The manufacturing method of claim 10, wherein
an area of an inner surface of the first substrate facing the second substrate is larger than an area of an inner surface of the second substrate facing the first substrate.

15. The manufacturing method of claim 10, wherein
the side face of the second substrate that is positioned further toward the second substrate center extends perpendicularly between a top surface and a bottom surface of the second substrate, and
the side faces at the two adjacent corners each extend perpendicularly between the top surface and the bottom surface of the second substrate.

\* \* \* \* \*